(12) United States Patent
Tsuji et al.

(10) Patent No.: US 6,730,916 B1
(45) Date of Patent: May 4, 2004

(54) ELECTRON BEAM LITHOGRAPHY APPARATUS

(75) Inventors: Hiroshi Tsuji, Kokubunji (JP); Mitsuru Inoue, Tochigi (JP); Norio Saitou, Tokorozawa (JP); Yasuhiro Someda, Fuchu (JP); Yoshimasa Fukushima, Hitachinaka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/691,234

(22) Filed: Oct. 19, 2000

(30) Foreign Application Priority Data

Oct. 22, 1999 (JP) ............................ 11-300836

(51) Int. Cl.[7] .......................... H01J 37/20; H01J 37/07; H02K 41/02
(52) U.S. Cl. ................ 250/442.11; 250/492.2; 310/13
(58) Field of Search .................. 250/442.11, 492.2; 310/13

(56) References Cited

U.S. PATENT DOCUMENTS

| | | | | |
|---|---|---|---|---|
| 4,607,167 A | * | 8/1986 | Petric ...................... | 250/492.2 |
| 6,072,251 A | * | 6/2000 | Markle ........................ | 310/12 |

FOREIGN PATENT DOCUMENTS

| JP | 53-94176 | 8/1978 |
|---|---|---|
| JP | 55-165628 | 12/1980 |
| JP | 56-36132 | 4/1981 |
| JP | 61-59825 | 3/1986 |
| JP | 1-125932 | 5/1989 |
| JP | 5-198469 | 8/1993 |
| JP | 6-44093 | 11/1994 |
| JP | 6-334381 | 12/1994 |
| JP | 7-201726 | 8/1995 |
| JP | 7-263300 | 10/1995 |
| JP | 10-217053 | 8/1998 |
| JP | 10-281110 | 10/1998 |
| JP | 10-302696 | 11/1998 |
| JP | 11-317353 | 11/1999 |

* cited by examiner

*Primary Examiner*—Jack Berman
(74) *Attorney, Agent, or Firm*—Fitzpatrick, Cella, Harper & Scinto

(57) ABSTRACT

An electron beam lithography apparatus of the present invention prevents the electron beam trajectory from being affected by a leakage magnetic field from a permanent magnet which is used as a sample stage guide/driving mechanism. In this electron beam lithography apparatus, an air bearing guide is used as a sample stage guide mechanism, and the stage posture is held by attracting the stage floating on a surface plate to the surface plate side by the permanent magnet. To avoid the leakage magnetic field from the permanent magnet from affecting the electron beam irradiation position on the sample, the permanent magnet is magnetically shielded by a shield member. In addition, to reduce variations in magnetic field above the sample, which are generated when the shield member moves in a leakage magnetic field from the electron lens, another shield member is arranged under the electron lens.

43 Claims, 26 Drawing Sheets

SECTIONAL VIEW TAKEN
ALONG LINE A-A'

ENLARGED VIEW
OF PORTION B

RELATIONSHIP BETWEEN POSITIONAL SHIFT OF
ELECTRON BEAM AND MAGNETIC FIELD CHANGE AMOUNT
(H=25(mm), E=10,30,50,100(kV))

SECTIONAL VIEW TAKEN ALONG LINE A - A'

EXTERNAL MAGNETIC FIELD SHIELD EFFECT OF PERMANENT MAGNET

SHIELD EFFECT FOR ELECTRON LENS LEAKAGE MAGNETIC FIELD

CROSS-SECTIONAL VIEW TAKEN ALONG LINE C - C'

CROSS-SECTIONAL VIEW TAKEN ALONG LINE D - D'

SECTIONAL VIEW TAKEN ALONG LINE E - E'

SECTIONAL VIEW TAKEN ALONG LINE F - F'

ENLARGED VIEW OF PORTION G IN FIG.24B

ELECTRON BEAM LITHOGRAPHY APPARATUS

FIELD OF THE INVENTION

The present invention relates to an electron beam lithography apparatus and, more particularly, to an electron beam lithography apparatus in which a leakage magnetic field from a stage driving mechanism that uses a permanent magnet is shielded to realize accurate lithography.

BACKGROUND OF THE INVENTION

In recent years, along with an increase in degree of integration of semiconductor elements, demand for a finer design rule has arisen. An electron beam lithography apparatus directly draws a fine pattern on a sample surface by converging an electron beam by an electron lens and deflecting it by a deflector.

The stage of the electron beam lithography apparatus is required to be able to operate under high-vacuum environment and be made of a non-magnetic material that does not change the electron beam position on the sample.

A factor that degrades the beam position accuracy due to a laser measurement system used for stage position control is Abbe error. This Abbe error is given by (change amount of stage posture)×(offset amount between the position to be drawn and laser measurement optical axis). For example, to suppress the Abbe error to 5 nm when the offset amount of the laser measurement optical axis is 1 mm, the allowable value of the stage posture change amount is 1 sec (=5 μrad). Conventionally, a rolling guide made of a non-magnetic cemented carbide alloy (to be referred to as a cemented carbide material hereinafter) as described in Japanese Patent Laid-Open No. 05-198469 is used as a stage guide. However, since the stage posture changes due to straightness errors of the guide, it is very difficult to suppress pitch/yaw/roll to 1 arc-sec or less.

In addition, since a ceramic table is softer than a rolling element formed from cemented carbide, the table slightly deforms as the rolling element moves. As a result, the distance between the sample and a measurement mirror changes on the nanometer order, and measurement errors occur. As described above, the position accuracy of a lithography pattern degrades due to Abbe errors or small deformation of the stage.

Such degradation in position accuracy is caused by a change in stage posture and the deformation amount of the stage. In consideration of this problem, when an air bearing guide for vacuum environment is used as a stage guide, a stage posture change of 1 sec or less can be achieved as long as the surface accuracy of the guide surface plate is on the submicron order. Additionally, since this stage guide is a non-contact moving mechanism, the deformation amount of the table is small. An air bearing guide for polygon mirror working machine, which is disclosed in Japanese Patent Laid-Open No. 10-217053 sometimes uses a permanent magnet in the stage as a pre-load applying means for preventing a change in stage posture. This permanent magnet attracts the stage main body to the guide surface plate side. A non-contact constraint means using the repelling force between permanent magnets in vacuum, which is disclosed in Japanese Patent Laid-Open No. 10-281110, is also effective to prevent the table from deforming as the stage moves. However, if the external leakage magnetic field from the permanent magnet is not shielded, the static magnetic field distribution of the permanent magnet moves as the stage moves, resulting in positional shift of the electron beam on the sample.

The allowable magnetic field change amount will be estimated from the viewpoint of electron beam position accuracy with reference to FIG. 4. Any variation in magnetic field present in the space between an electron lens 5 and a sample 7 changes the position illuminated by an electron beam 4. Let H be the distance from the lower surface of the electron lens 5 to the sample 7, and ΔB(T) be the variation amount of the magnetic field in this space. Electrons that have passed through the electron lens 5 are affected by the variation in magnetic field, deflected by a deflection angle θ along an orbit with a Bohr radius R, and reach a point separated from the target irradiation position by ΔX.

Where the deflection angle θ is sufficiently small, ΔX can be approximated by $$\Delta X = H^2/(2R) \qquad (1)$$

The Bohr radius R is given by $$R = mv/(e\Delta B) \qquad (2)$$

where m: the mass of electrons m=9.1×10$^{-3}$ (kg)

e: the charge of electrons e=1.6×10$^{-8}$ (C)

v: the velocity of electrons

Substitution of the Bohr radius into equation (1) yields $$\Delta X/\Delta B = eH^2/(2mv) \qquad (3)$$

On the other hand, the energy of electrons is given by $$E = mv^2/2 \qquad (4)$$

Elimination of v from equations (3) and (4) yields $$\Delta X/\Delta B = eH^2/(2\sqrt{(2mE)}) \qquad (5)$$

FIG. 5 is a graph showing the relationship (calculation values) between the beam position shift and the magnetic field when the acceleration voltage is used as a parameter assuming ΔX=10 nm and H=25 mm. When a change in magnetic field is 2×10$^{-8}$ T or less, and the acceleration voltage is 30 kV or more, the positional shift of the beam is 10 nm or less. Hence, the leakage magnetic field from the permanent magnet must be shielded such that it becomes 2×10$^{-8}$ T or less.

On the other hand, the leakage magnetic field from the electron lens is always present in the space under the electron lens. A shield member formed from a ferromagnetic material moves in the leakage magnetic field of the electron lens. This disturbs the magnetic field in the space from the lower surface of the electron lens to the sample and causes a positional shift of electron beam on the sample. To reduce this positional shift amount, the leakage magnetic field from the electron lens must also be made small.

For accurate lithography, both the leakage magnetic field from the permanent magnet and that from the electron lens must be shielded, and the magnetic field change amount at the sample position must be reduced to 2×10$^{-8}$ T or less.

SUMMARY OF THE INVENTION

It is therefore an object of the present invention to provide an electron beam lithography apparatus suitable for accurate lithography and to provide an apparatus structure capable of reducing the magnetic field change amount at the sample position to 2×10$^{-8}$ T or less.

In order to achieve the above object, according to the present invention, a leakage magnetic field from a permanent magnet in a stage main body is reduced by shielding all surfaces of the permanent magnet except the attracting surface by a ferromagnetic material.

A leakage magnetic field generated when a shield moves in a leakage magnetic field from an electron lens is reduced by providing a shield for reducing the A leakage magnetic field from the electron lens on the lower surface of an electron optical lens-barrel.

With the above-described two shield means, even when the stage moves, the external leakage magnetic field from the permanent magnet or electron lens does not affect the electron beam irradiation position, and accurate lithography can be realized.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The embodiments of the present invention will be described below in detail with reference to the accompanying drawings.

To minimize the leakage magnetic field from a magnet incorporated in the stage main body as much as possible, the lines of magnetic force from the magnet are designed to form a closed loop. For, e.g., a multi-pole magnet having alternate N and S poles, when the magnet is attached to a yoke made of a ferromagnetic material, the lines of magnetic force from the N and S poles cancel each other to greatly reduce the leakage magnetic field on the yoke attachment surface. Similarly, when the attracting surface is set close to the surface plate, the lines of magnetic force from the N and S poles cancel each other to reduce the leakage magnetic field. However, when the magnetic field of the magnet itself is 1 T or more, changes in magnetic field can hardly be reduced to the allowable value of $2 \times 10^{-8}$ T or less.

To reduce the leakage magnetic field of the magnet, all surfaces of the magnet, excluding the attracting surface, are shielded by a ferromagnetic material having high permeability. Since the ferromagnetic material is magnetized upon machine working, it must be heated and demagnetized after working.

To reduce the leakage magnetic field of a permanent magnet, the generated magnetic field is reduced by forming a closed loop of lines of magnetic force, and the generated magnetic field is shielded.

On the other hand, to reduce disturbance in leakage magnetic field of an electron lens along with movement of a magnetic field shield, a magnetic field shield is provided under an electron optical lens-barrel while preventing any influence on deflection for lithography.

When both the generated magnetic field of the electron lens and that of the permanent magnet are shielded, the magnetic field variation amount at the sample position can be suppressed to the allowable value of $2\times10^{-8}$ T or less for electron beam lithography.

First Embodiment

Figure 1:
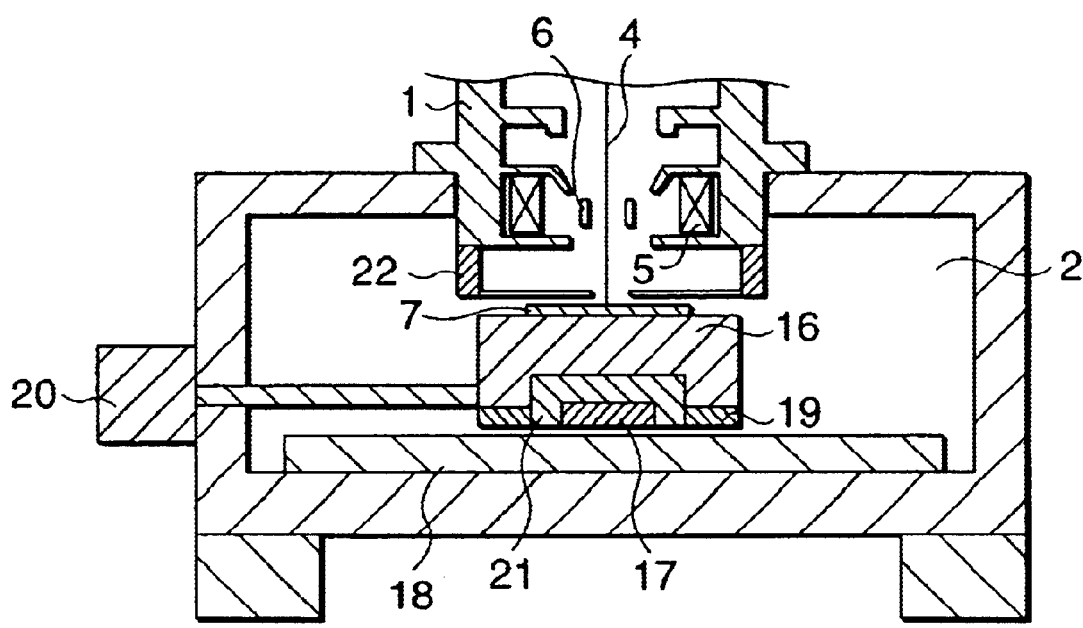
FIG. 1 is a sectional view showing the schematic arrangement of a portion under the electron optical lens-barrel of an electron beam lithography apparatus according to the first embodiment of the present invention.

FIG. 1 is a sectional view showing the schematic arrangement of a portion under the electron optical lens-barrel of an electron beam lithography apparatus according to the first embodiment of the present invention.

Figure 2:
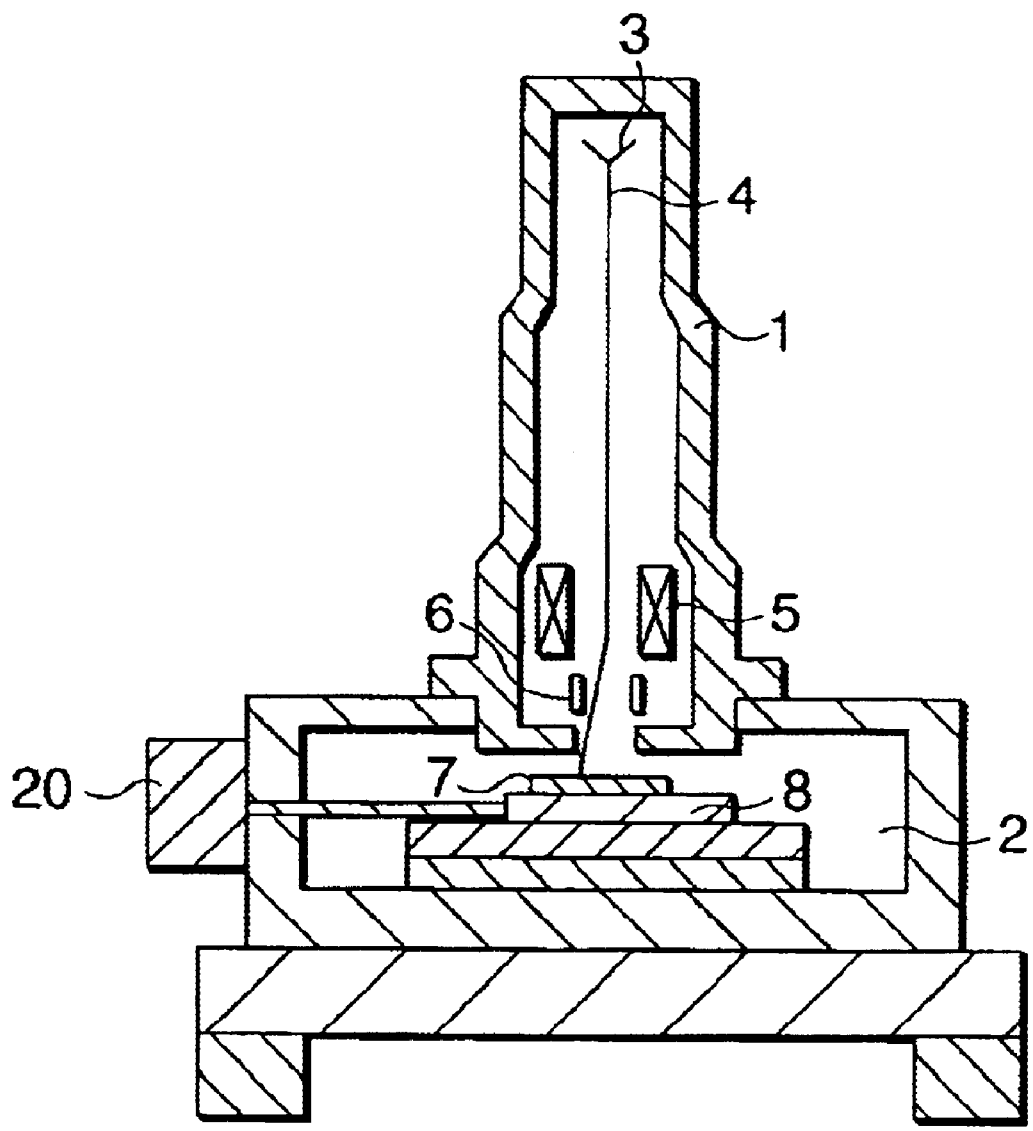
FIG. 2 is a sectional view schematically showing the overall arrangement of the electron beam lithography apparatus.

FIG. 2 is a sectional view schematically showing the overall arrangement of the electron beam lithography apparatus. The interior of an electron optical lens-barrel 1 and that of a sample chamber 2 are held in vacuum. An electron beam 4 from an electron gun 3 in the electron optical lens-barrel 1 is converged by an electron lens 5 and deflected by a deflector 6 so that a predetermined position on a sample 7 is irradiated with the electron beam. The sample 7 is placed on a sample stage 8 in the sample chamber 2. When the surface of the sample 7 is irradiated with the electron beam 4 deflected and scanned while moving the sample stage 8 by a stage driver 20, a desired pattern can be drawn on the entire surface of the sample 7.

Figure 3A:
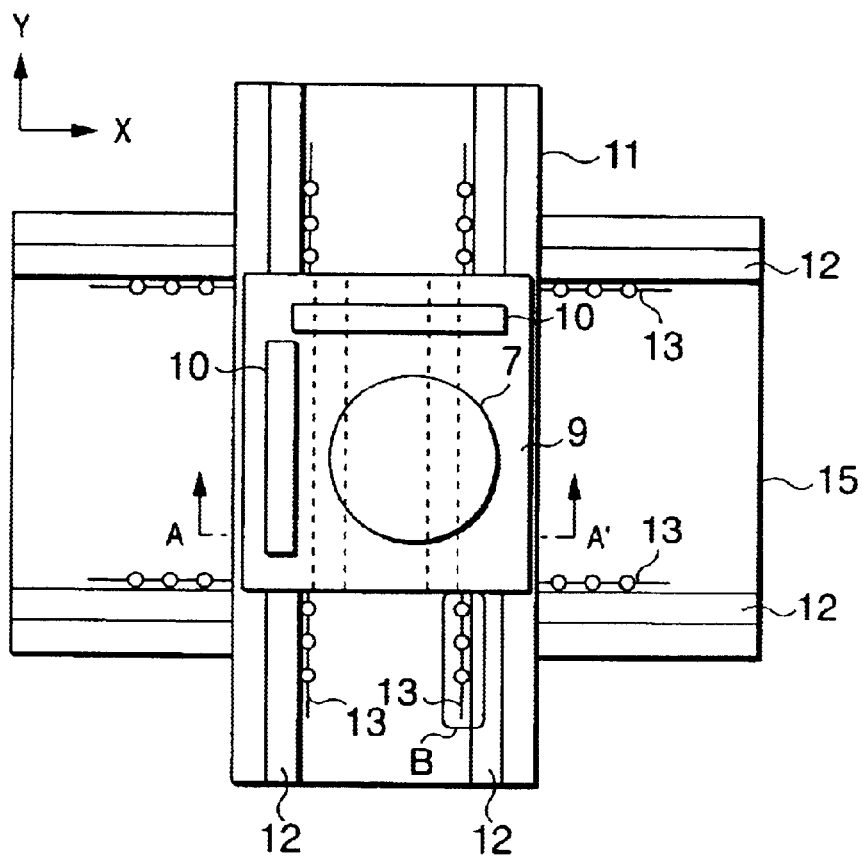
FIGS. 3A to 3C are plan, sectional, and enlarged views, respectively, showing a conventional sample stage.
Figure 3B:
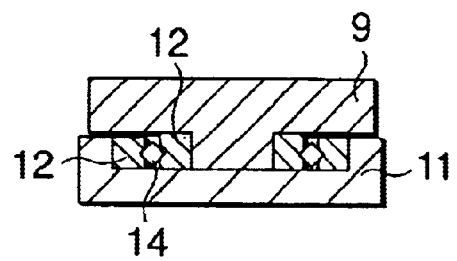
Figure 3C:
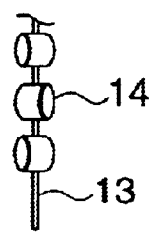
Figure 4:
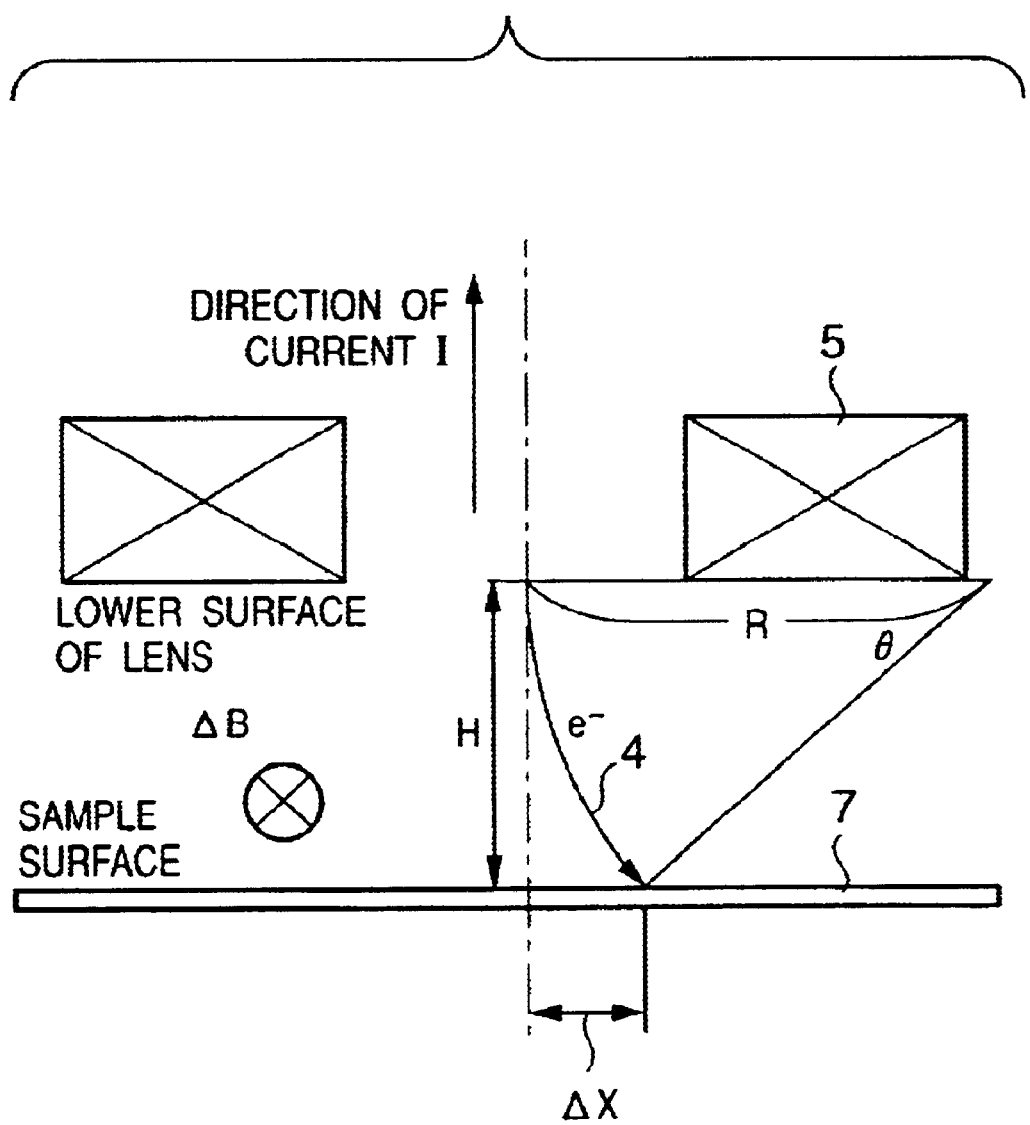
FIG. 4 is a view for explaining a state in which the path or trajectory of an electron beam is changed by a uniform magnetic field present in a space above a sample.
Figure 5:
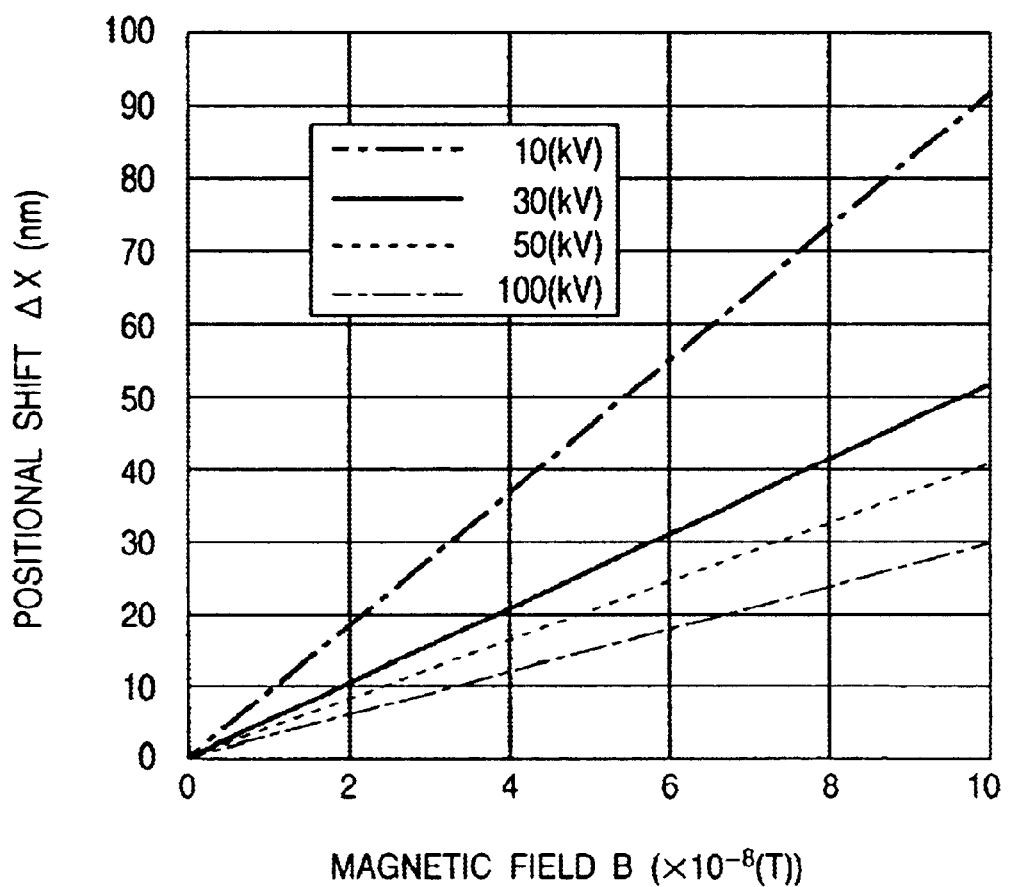
FIG. 5 is a graph showing the relationship between the magnetic field change amount and the electron beam irradiation position shift.

FIGS. 3A to 3C are plan, sectional, and enlarged views, respectively, showing a conventional sample stage. Referring to FIGS. 3A to 3C, a sample 7 and stage position measurement bar mirrors 10 are placed on a Y-table 9. In lithography, the sample position is obtained by measuring the positions of the bar mirrors 10 by laser measurement.

The Y-table 9 and X-table 11 have the relationship as shown in the sectional view of FIG. 3B taken along a line A–A' in FIG. 3A. Cemented carbide guides 12 are attached to the inner surfaces of the concave portion of the X-table 11 and the outer surfaces of the convex portion of the Y-table 9, respectively. The cemented carbide guides 12 have V-grooves on their opposing surfaces. A crossed roller 13 is inserted between each pair of V-grooves. The Y-table 9 moves relative to the X-table 11 through the crossed rollers 13. As shown in FIG. 3C or an enlarged view of a portion B, the crossed roller 13 has a plurality of column-shaped rollers 14 whose directions alternate by 90°. The X-table 11 and a base 15 also have, therebetween, the same structure as described above. The X-table 11 moves relative to the base 15 through the crossed rollers 13.

Since the Y-table 9 moves while rotating the rollers 14, the convex portion of the Y-table 9 receives a compression force from the rollers 14. When this compression force varies, the Y-table 9 made of a ceramic slightly deforms by about 50 nm at maximum. Since this deformation changes the positions of the sample 7 and bar mirrors 10, the irradiation position accuracy of the electron beam 4 degrades, as is known.

In the first embodiment, under vacuum environment, while a stage 16 is supported to float by the force of air blown from an air pad, the floating stage 16 is attracted to a surface plate 18 by the attracting force of a permanent magnet 17, as shown in FIG. 1.

An air pad 19 which simultaneously blows and draws a gas is attached to the bottom surface of the stage 16. The stage 16 is attracted to the surface plate 18 by the attracting force of the permanent magnet 17 serving as a pre-load applying means. The stage 16 is driven by the stage driver 20 and moves along the upper surface of the surface plate 18. Since the floating position of the stage 16 is determined by balancing the attracting force of the permanent magnet 17 and the reaction (floating force) of the air stream, the rigidity of the stage 16 in running is maintained.

To prevent influence of the magnetic field of the permanent magnet 17 on the electron beam irradiation position, all surfaces of the permanent magnet 17 except the attracting surface are shielded by a magnetic field shield 21. In addition, to reduce the leakage magnetic field from the electron lens 5 into the sample chamber 2, an electron lens leakage magnetic field shield 22 is attached to the lower surface of the electron optical lens-barrel 1.

Figure 6A:
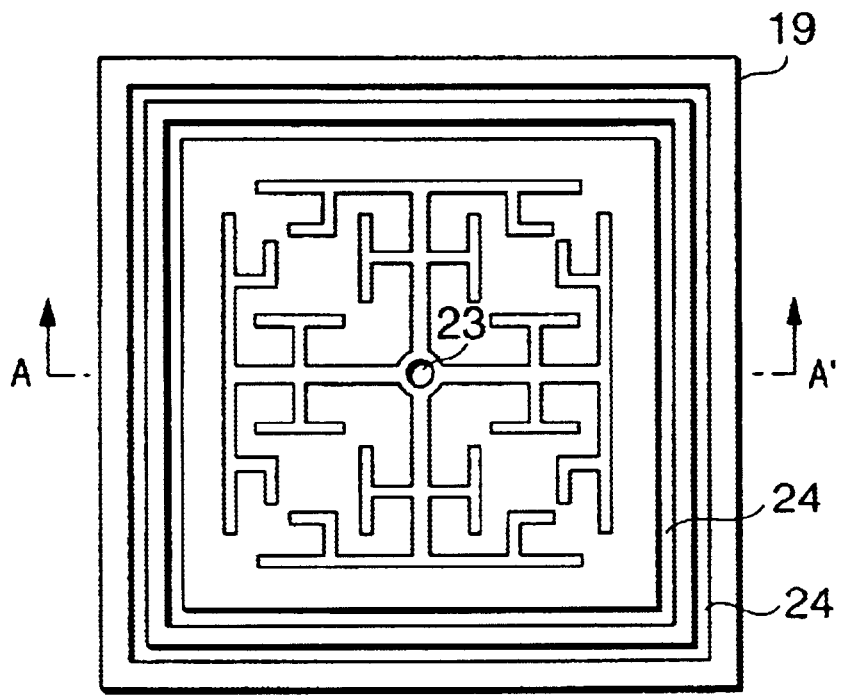
FIGS. 6A and 6B are plan and sectional views, respectively, showing the structure of an air pad of the first embodiment.
Figure 6B:
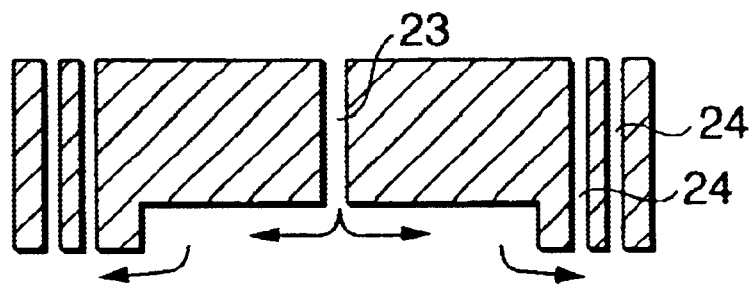

FIGS. 6A and 6B are views showing the structure of the air pad 19. FIG. 6A is a plan view showing the air pad 19 from the lower side. FIG. 6B is a sectional view taken along a line A–A' in FIG. 6A. The air pad 19 has a blow port 23 and suction ports 24. A gas is blown from the blow port 23 to apply a floating force to the stage 16 and float it on the surface plate 18. The blown gas is recovered from the suction ports 24.

Figure 7A:
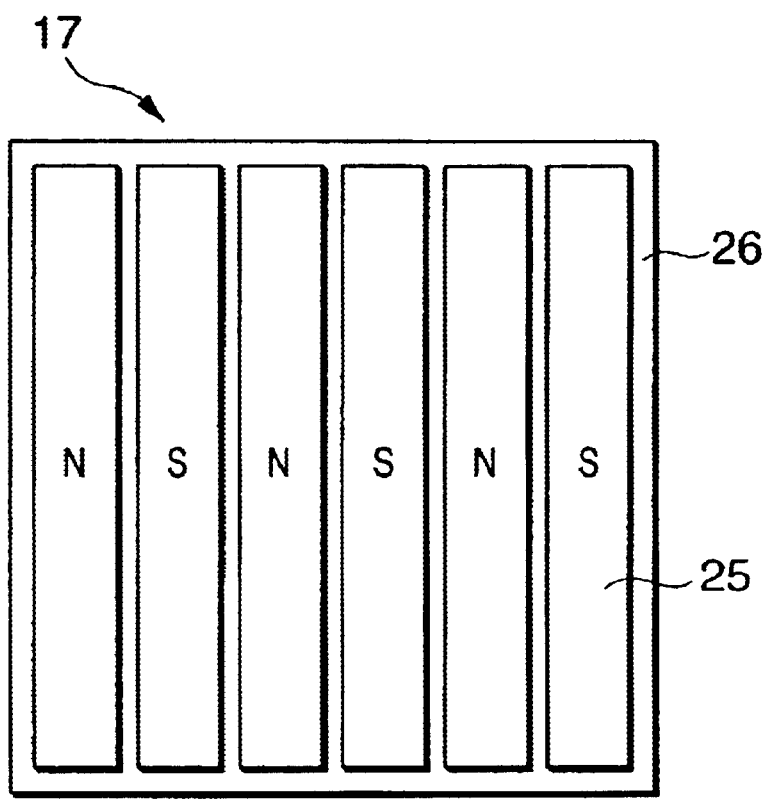
FIGS. 7A and 7B are plan and side views, respectively, showing the structure of a permanent magnet (multi-pole magnet) of the first embodiment.
Figure 7B:
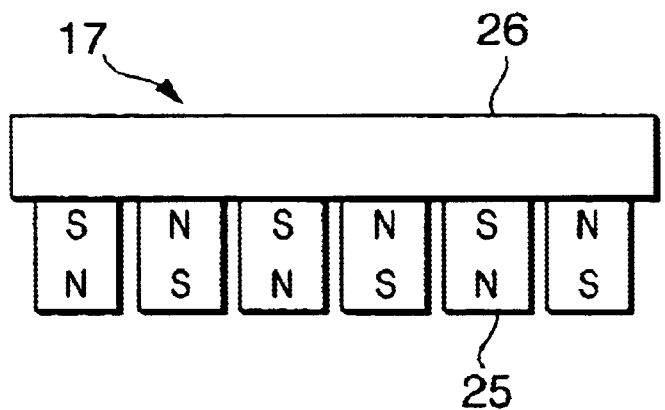

FIGS. 7A and 7B are views showing a multi-pole magnet structure as the permanent magnet 17. FIG. 7A is a plan view showing the permanent magnet 17 from the lower side. FIG. 78 is a side view. A plurality of plate magnets 25 are polarized in the vertical direction (direction perpendicular to the surface plate surface). N and S poles alternate on the lower surface (attracting surface) side of the magnets. The upper surface (surface on the opposite side of the attracting surface) of each magnet is fixed to a yoke 26. This yoke 26 reduces the leakage magnetic field to the upper side of the magnets.

Figure 8:
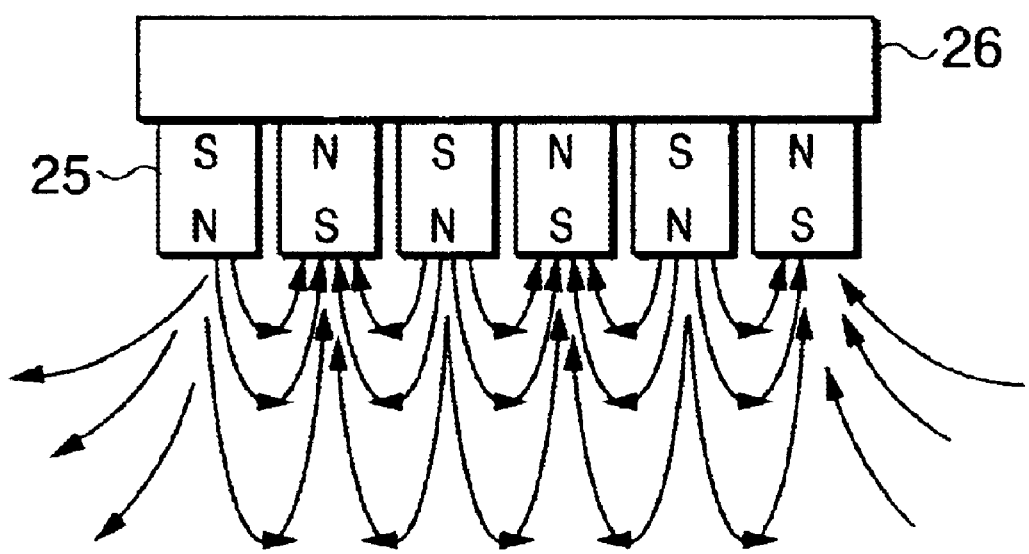
FIG. 8 is a view showing the emission state of lines of magnetic force from the multi-pole magnet shown in FIG. 7.

As shown in FIG. 8, on the yoke 26 side, the poles of the plate magnets 25 are short-circuited by the yoke 26, so almost no lines of magnetic force leaks from the yoke 26 to the external space. However, on the attracting surface side, the lines of magnetic force run from the N poles to the S poles through the external space.

Figure 9:
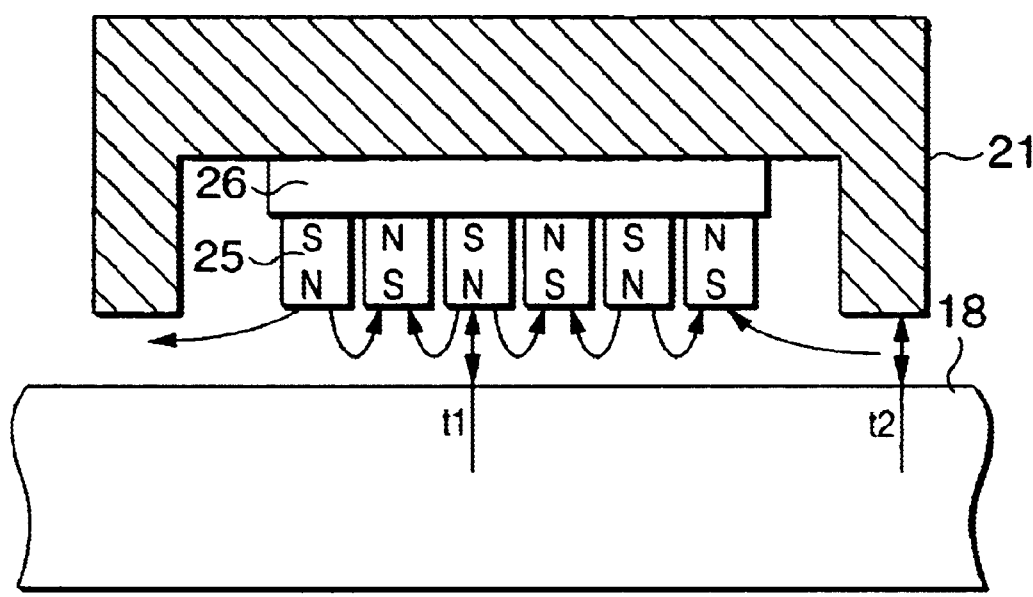
FIG. 9 is a view showing the layout of a single-layered shield of the first embodiment.
Figure 10:
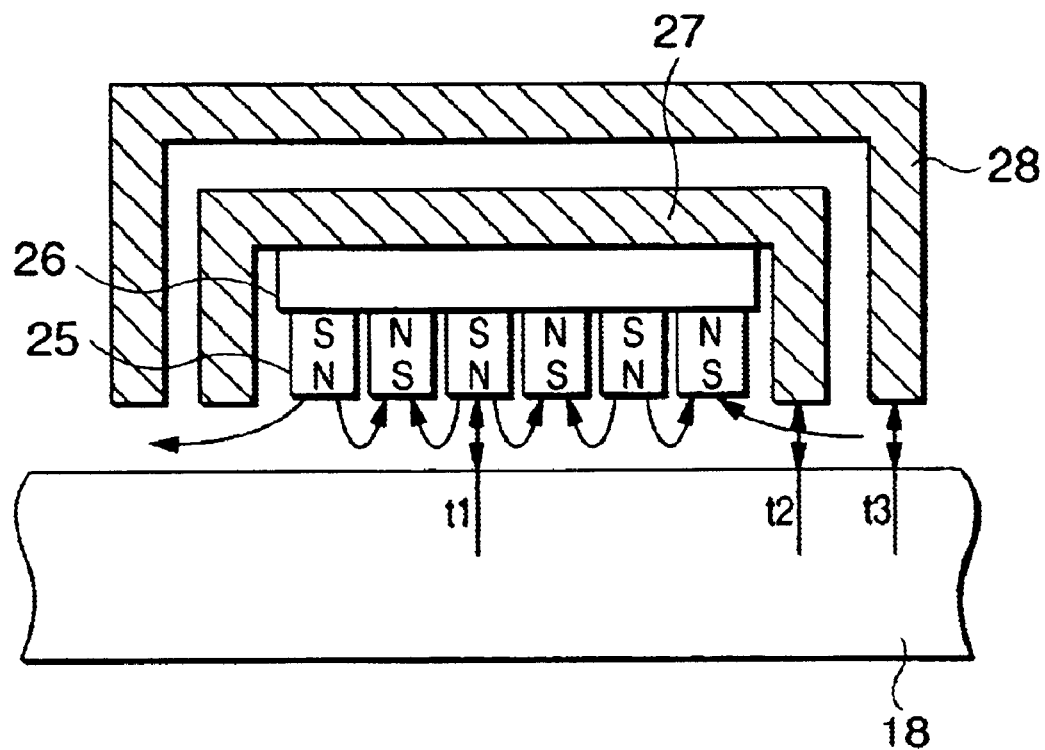
FIG. 10 is a view showing the layout of multiple shields of the first embodiment.

FIG. 9 is a view showing the layout of the H surface plate 18, plate magnets 25, and magnetic field shield 21 when the stage 16 is floating. When the distance between the plate magnets 25 and the surface plate 18 and that between the magnetic field shield 21 and the surface plate 18 are set to t1 and t2 (t1 and t2>0), respectively, some lines of magnetic force leak from the shield 21 to the external space through the gap. To more effectively reduce the leakage magnetic field to the external space, the magnetic field shield 21 may have a multiple structure. Referring to FIG. 10, an inner shield 27 (gap: t2) is provided immediately outside the yoke 26 and an outer shield 28 (gap: t3) is provided outside the inner shield 27 via a space.

Figure 11:
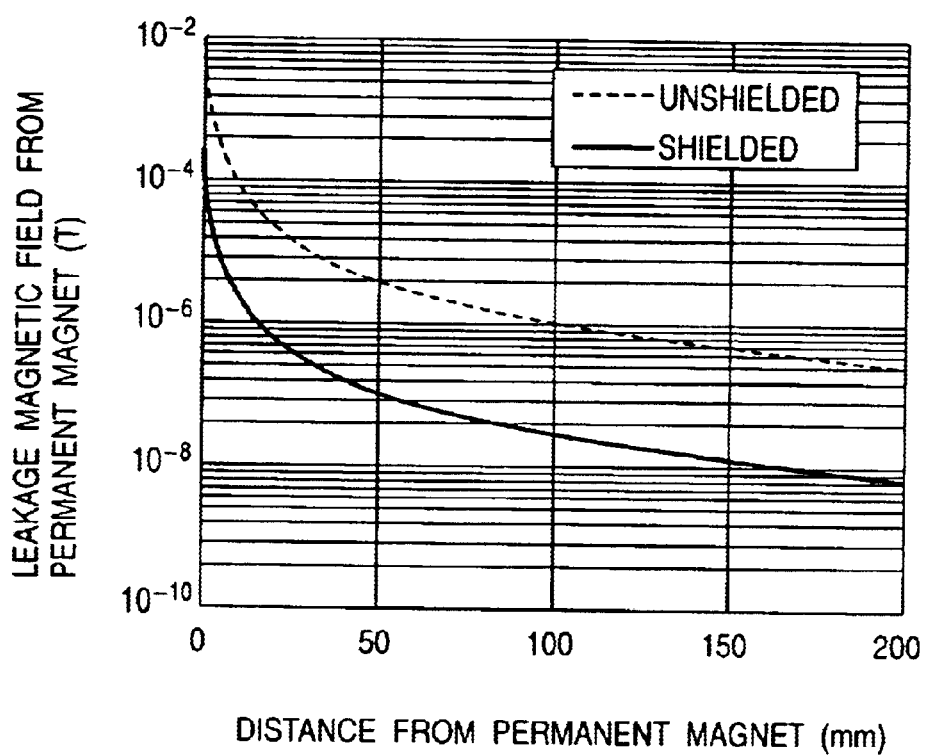
FIG. 11 is a graph showing the leakage magnetic field reduction effect of a magnetic field shield structure of the first embodiment.

FIG. 11 is a graph showing the leakage magnetic field strength to the external space when the heights (gaps: t1, t2, and t3) from the upper surface of the surface plate 18 to the plate magnets 25, inner shield 27, and outer shield 28 are set to 0.1 mm in the layout shown in FIG. 10. The magnetic field strength curves shown in FIG. 11 are calculated from $$B=Pm/(4\pi\mu_0 H^2) \tag{6}$$

where B: magnetic field strength

Pm: magnetic moment of magnetic dipole (magnet)

$\mu_0$: permeability in vacuum/$\mu_0$=1.3×10$^{-6}$ (H/m)

H: distance from the magnetic dipole (magnet).

This equation represents that the actual measurement value of magnetic field strength and the magnetic field strength are in reverse proportion to the square of distance at a specific position outside the permanent magnet in the horizontal direction.

As is apparent from FIG. 11, at a position separated from the permanent magnet by 100 mm, when no shield structure is provided, the leakage magnetic field strength from the permanent magnet decreases to only $\times 10^{-6}$ T. When the shield structure shown in FIG. 10 is employed, it decreases to $2 \times 10^{-8}$ T. This fact reveals that a sufficient reduction effect (shield effect) for the leakage magnetic field from the permanent magnet can be obtained by the shield structure shown in FIG. 10.

Figure 12:
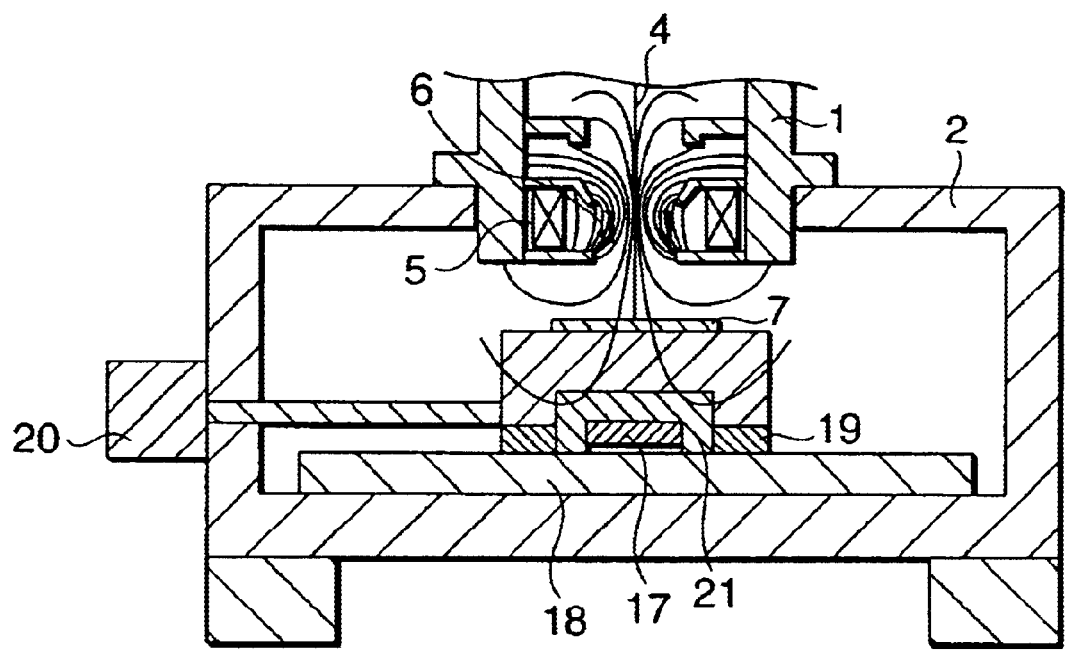
FIG. 12 is a sectional view showing the influence of the electron lens leakage magnetic field on the magnetic field shield structure in the first embodiment.
Figure 13:
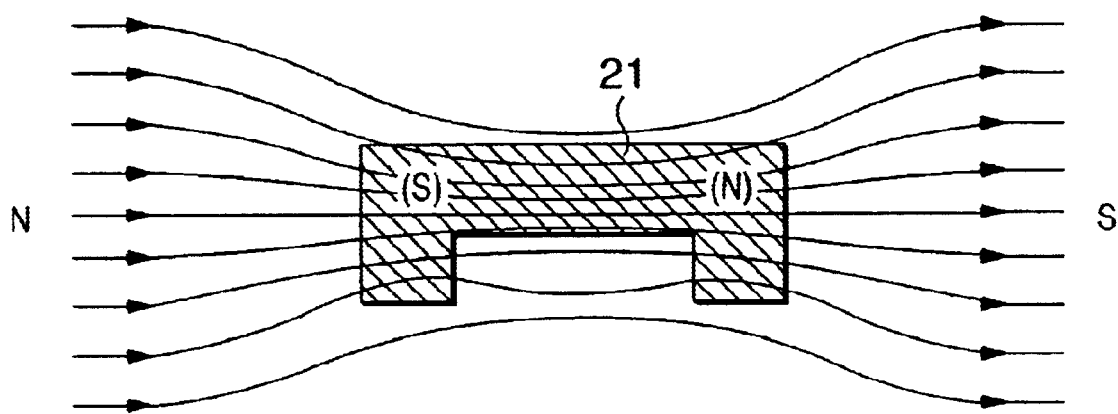
FIG. 13 is a view showing the disturbance in unique magnetic field by a magnetic field shield made of a ferromagnetic material.

As shown in FIG. 12, the leakage magnetic field from the electron lens 5 is present under the electron lens 5. When the above-described magnetic field shield 21 is placed in this leakage magnetic field, the magnetic field in a region around the magnetic field shield 21 made of a ferromagnetic material is disturbed, as shown in FIG. 13, to change the magnetic field on the sample 7, and this change in magnetic field on the sample 7 causes an irradiation position shift of the electron beam 4. To prevent this change in magnetic field on the sample, the leakage magnetic field from the electron lens 5 must be reduced.

Figure 14:
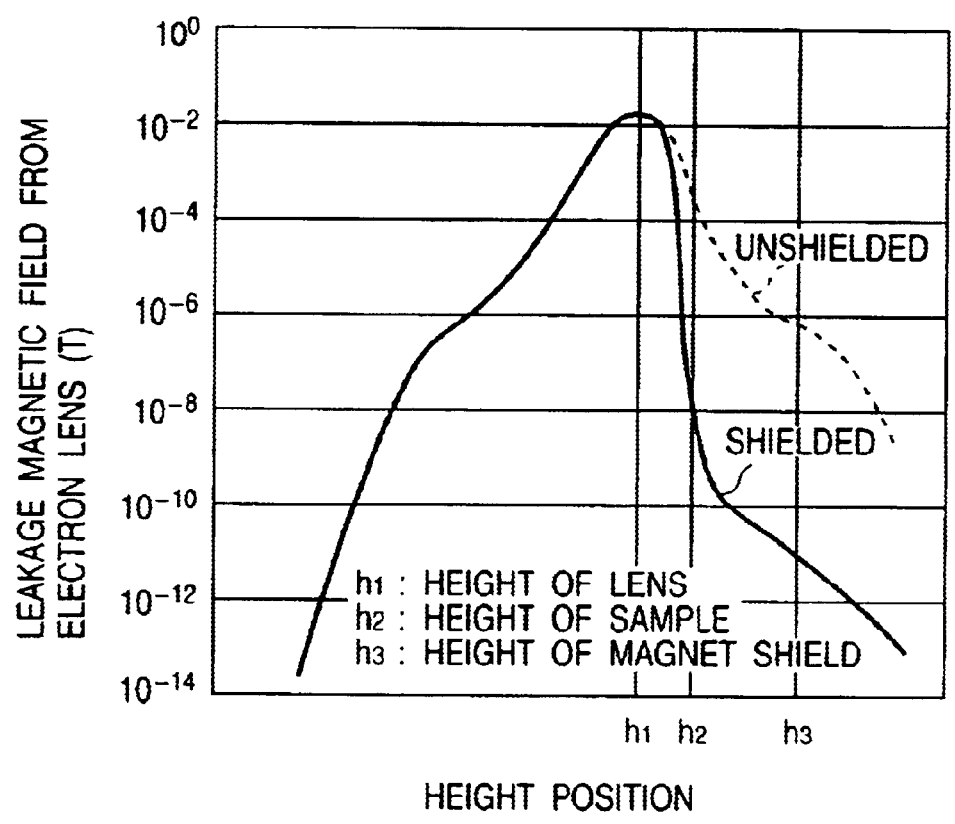
FIG. 14 is a graph showing the shield effect of the electron lens leakage magnetic field shield.

In this embodiment, the electron lens leakage magnetic field shield 22 is provided beneath the electron lens 5. FIG. 14 is a graph showing the leakage magnetic field shield effect in this case. The maximum magnetic field strength in the electron lens 5 (height position: h1) is $10^{-2}$ T. The leakage magnetic field strength attenuates as the distance from the electron lens 5 increases. If the shield 22 is not provided, the magnetic field strength is $10^{-4}$ T at a sample height position h2 and $10^{-6}$ T at a height position h3 of the shield 21. In this case, the magnetic field variation amount generated along with the movement of the magnetic field shield 21 exceeds $10^{-8}$ T, resulting in a shift in irradiation position of the electron beam 4 on the sample 7.

When the shield 22 of the present invention is provided, the leakage magnetic field strength from the electron lens 5 can be reduced to $10^{-8}$ T at the position of the sample 7 and $10^{-11}$ T at the position of the shield 21. For this reason, the magnetic field variation amount generated along with the movement of the magnetic field shield 21 is inevitably $10^{-11}$ T or less. This magnetic field variation amount hardly affects the irradiation position of the electron beam 4 on the sample 7.

With the above arrangement, the height position and posture of the sample stage 16 can be controlled in a non-contact state, and the leakage magnetic field from the permanent magnet 17 and electron lens 5 can be prevented from affecting the electron beam irradiation position. Hence, accurate lithography can be realized.

To further increase the leakage magnetic field shield effect in the arrangement shown in FIG. 9, letting t1 be the distance between the surface plate 18 and the plate magnets 25 serving as a magnetic force constraint means, and t2 be the distance between the surface plate 18 and the magnetic field shield 21, the plate magnets 25 and magnetic field shield 21 are preferably laid out relative to the surface plate 18 such that t1>t2 holds. To further increase the leakage magnetic field shield effect in the arrangement shown in FIG. 10, t1>t2 and t1>t3 preferably hold.

Second Embodiment

Figure 15:
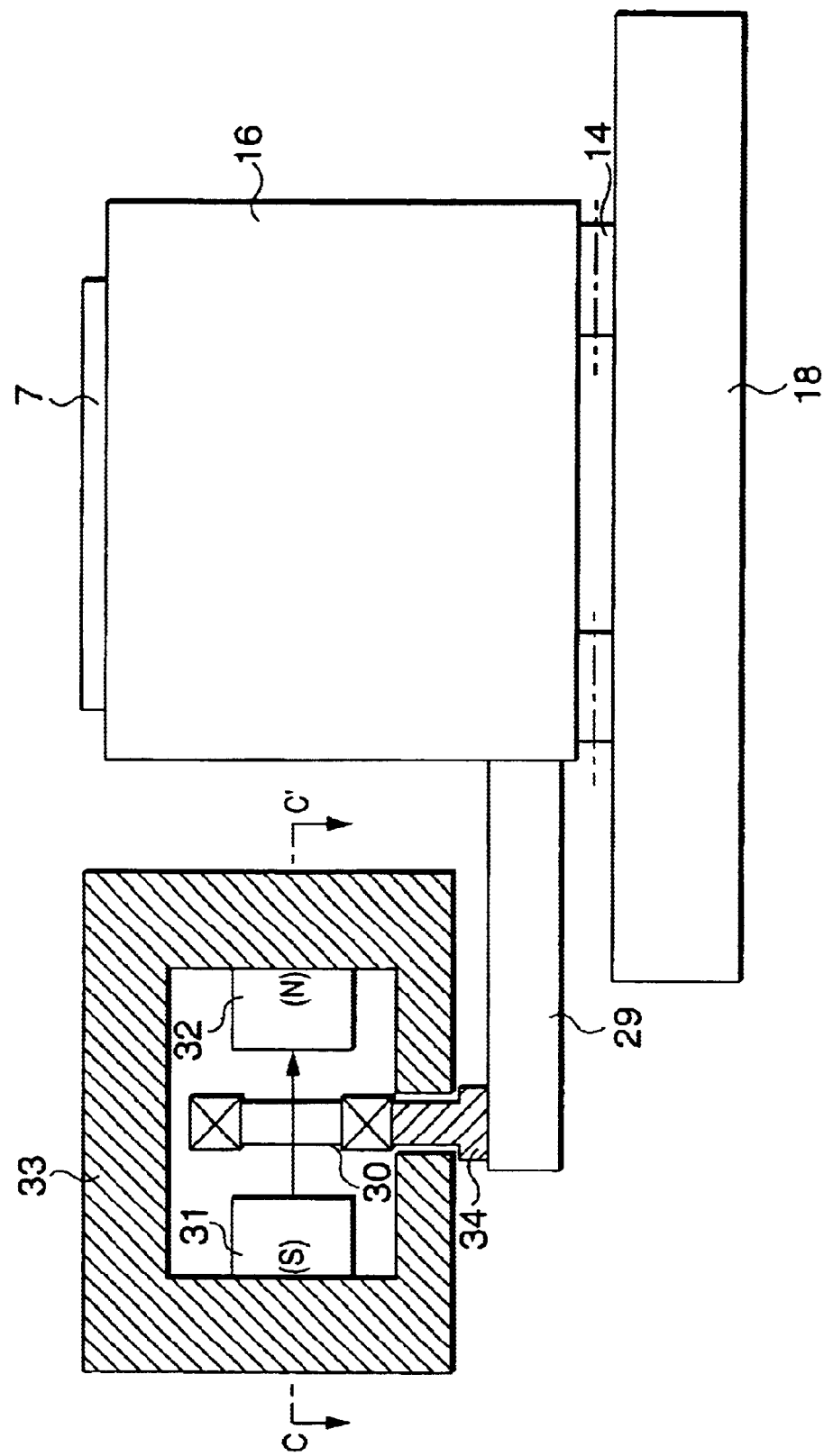
FIG. 15 is a view showing the structure of a sample stage portion in an electron beam lithography apparatus according to the second embodiment of the present invention.

FIG. 15 is a view showing the structure of a stage portion in an electron beam lithography apparatus according to the second embodiment of the present invention. This embodiment is related to a magnetic field shield structure employed when a single-axis linear motor is used to drive the stage.

Referring to FIG. 15, a sample 7 is placed on a stage 16. Rollers 14 are inserted between a surface plate 18 and the stage 16. A power transmission frame 29 is attached to the stage 16 main body. A driving coil 30 is fixed to the end portion of the power transmission frame 29. Permanent magnets 31 and 32 are arranged on both sides of the driving coil 30. The permanent magnets 31 and 32 are attached to the inner walls of a fixed yoke 33 which also serves as a guide. According to the principle of the single-axis linear motor shown in FIG. 15, a driving force is generated by interaction between the fixed magnetic field generated by the permanent magnets 31 and 32 and the current by the movable driving coil 30. (Fleming's rule)

The leakage magnetic field from the permanent magnets 31 and 32, and the magnetic field generated by the current of the coil 30 can be reduced using a high-permeability material for the fixed yoke 33 which surrounds the permanent magnets 31 and 32. For the magnetic field generated by the current of the driving coil 30, the leakage magnetic field to the external space is reduced by providing a movable yoke 34 made of a high-permeability material on the lower surface of the driving coil 30. An example of the high-permeability material is Permalloy.

Figure 16:
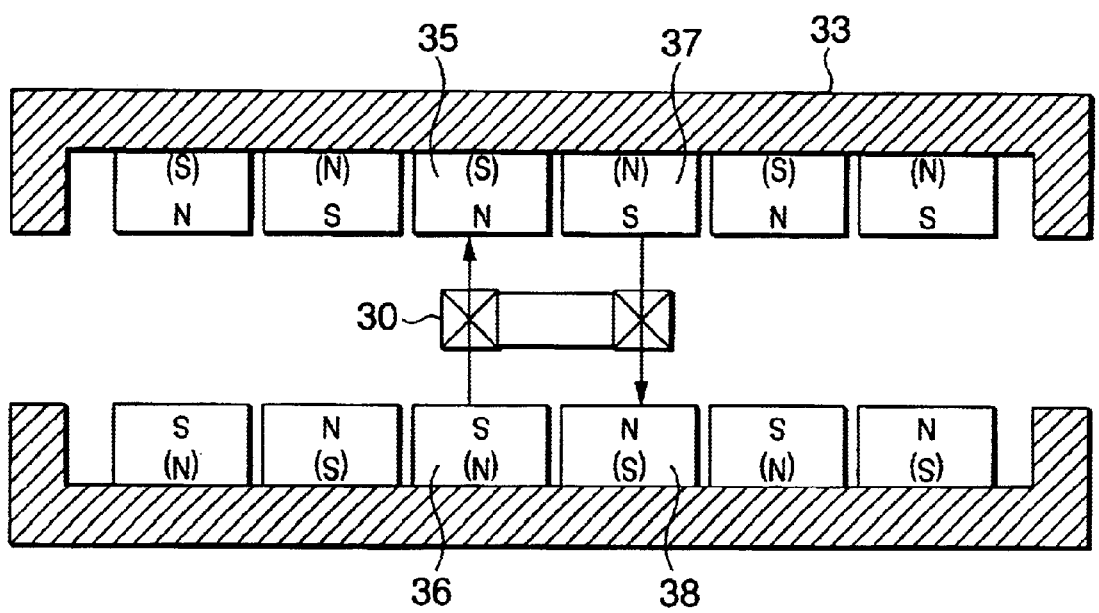
FIG. 16 is a cross-sectional view showing a structure taken along a line C–C' in FIG. 15.

FIG. 16 is a cross-sectional view showing a section taken along a line C–C' in FIG. 15. When a current is flowed to the driving coil 30, an attracting force acts between the driving coil 30 and permanent magnets 35 and 36 while a repelling force acts between the driving coil 30 and permanent magnets 37 and 38. In accordance with the force, the driving coil 30 receives a force for moving itself in one direction (to the left in FIG. 16).

In the structure shown in FIG. 15, the stage 16 is supported and guided by the rollers 14 on the surface plate 18. However, the present invention is not limited to this, and the stage 16 may be supported by needle roller guides, crossed roller guides, or air bearing guides.

Third Embodiment

Figure 17:
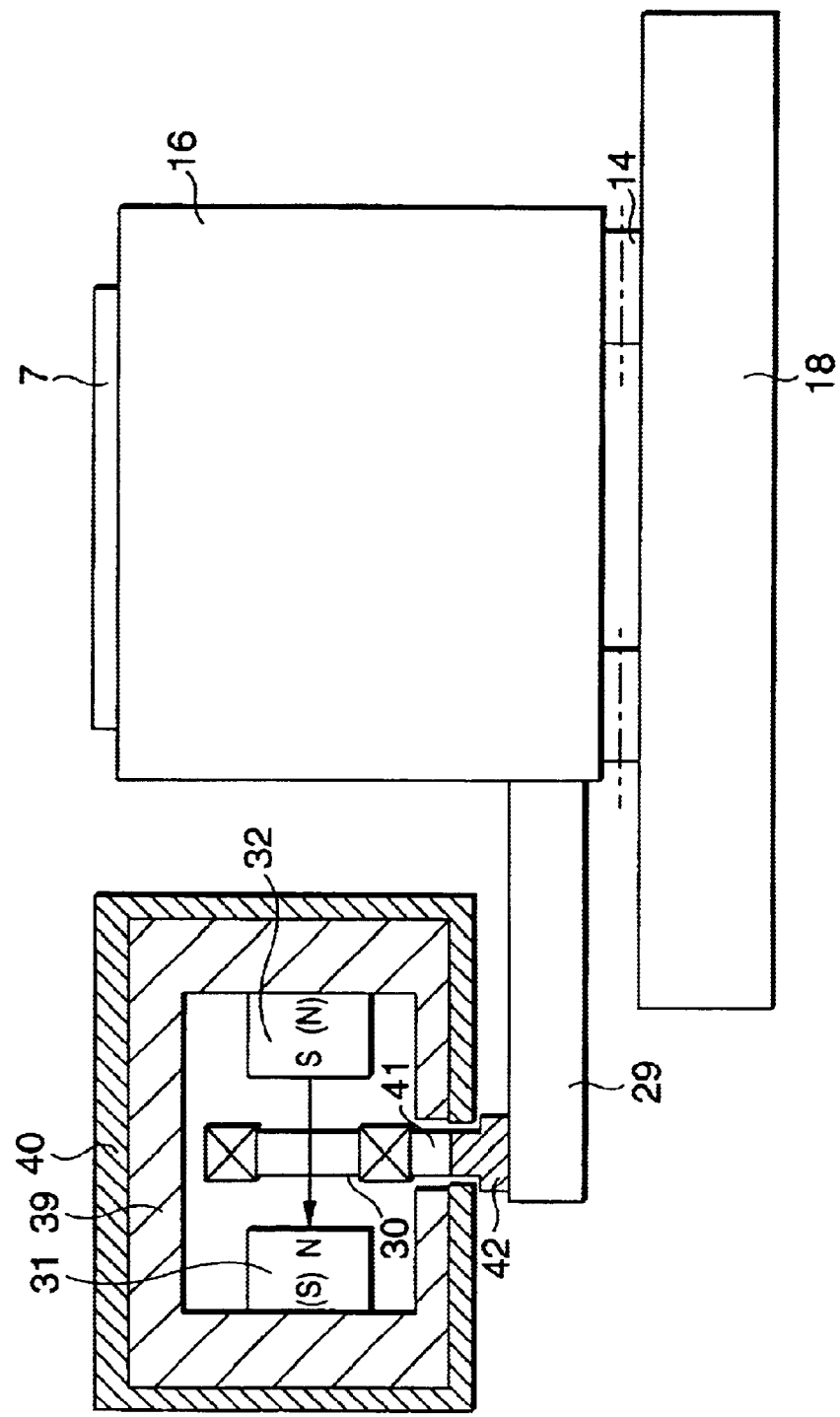
FIG. 17 is a view showing the structure of a sample stage portion in an electron beam lithography apparatus according to the third embodiment of the present invention.

FIG. 17 is a view showing the structure of a stage portion in an electron beam lithography apparatus according to the third embodiment of the present invention. In this embodiment, permanent magnets 31 and 32 which construct a stage driving linear motor are surrounded by a fixed yoke 39 made of a ferromagnetic material, thereby reducing the external leakage magnetic field from the permanent magnets 31 and 32. In addition, a fixed shield 40 made of a high-permeability material is provided around the fixed yoke 39, thereby shielding the leakage magnetic field from the fixed yoke 39. For the magnetic field generated from a movable driving coil 30 as well, the external leakage magnetic field is reduced by a movable yoke 41 made of a ferromagnetic material and a movable shield 42 made of a high-permeability material. An example of the ferromagnetic material is an iron-based material. An example of the high-permeability material is Permalloy.

The double shield structure of this embodiment is more effective to prevent external leakage of the strong magnetic field generated in the linear motor.

Fourth Embodiment

Figure 18:
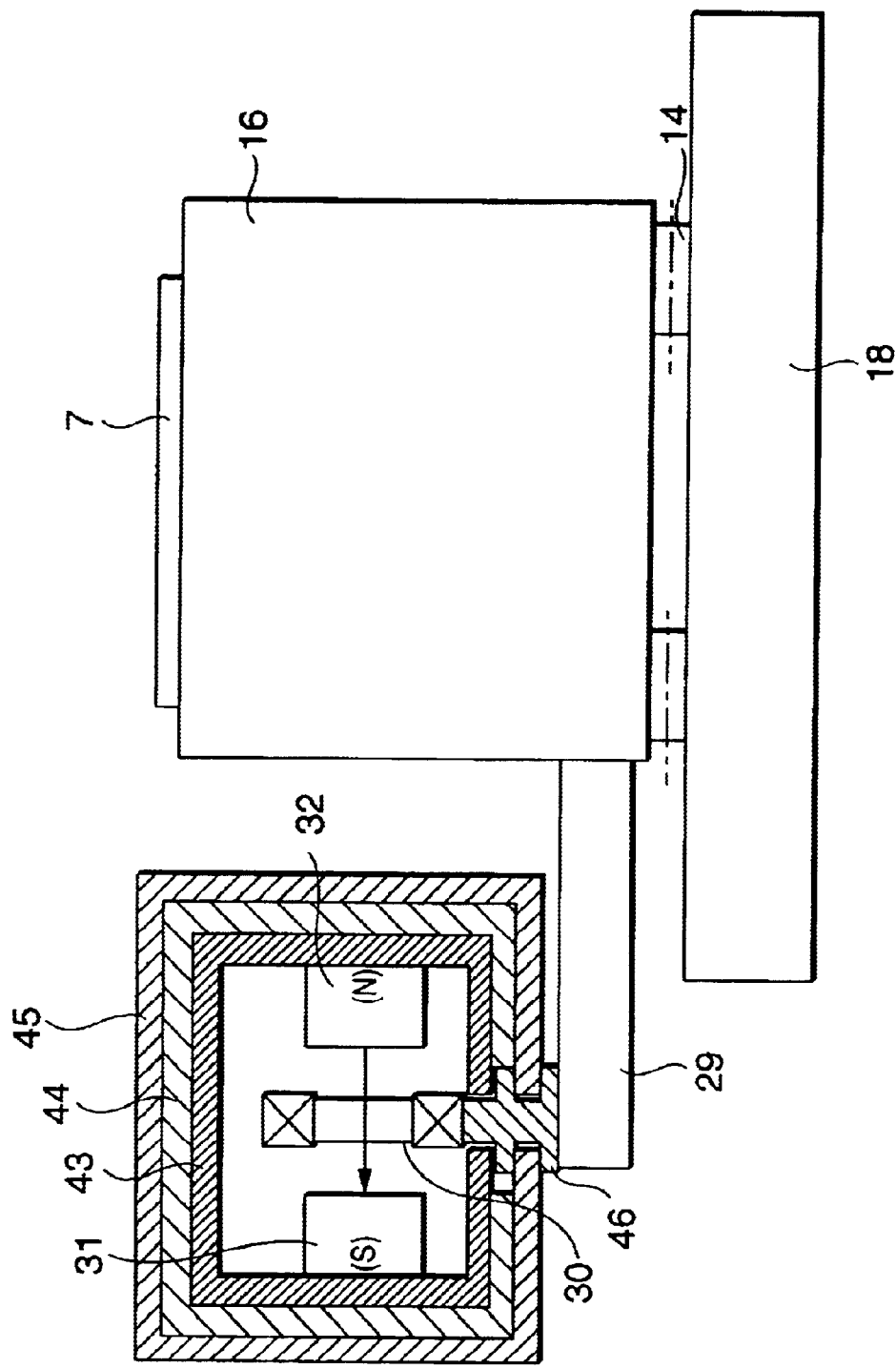
FIG. 18 is a view showing the structure of a sample stage portion in an electron beam lithography apparatus according to the fourth embodiment of the present invention.

FIG. 18 is a view showing the structure of a stage portion in an electron beam lithography apparatus according to the fourth embodiment of the present invention. In this embodiment, the magnetic field generated by permanent magnets 31 and 32 in the stage driving linear motor is reduced by a fixed yoke 43 formed from a high-permeability material. In addition, the magnetic field is shielded by a fixed shield 45 made of a high-permeability material through a spacer 44 made of a non-magnetic material. For the magnetic field generated by a movable driving coil 30 as well, the external leakage magnetic field is reduced by providing a movable shield 46 made of a high-permeability material. For example, Permalloy can be used as the high-permeability material. The double shield structure of this embodiment can more effectively prevent the magnetic field from the stage driving system from directly leaking to the external space.

Fifth Embodiment

Figure 19:
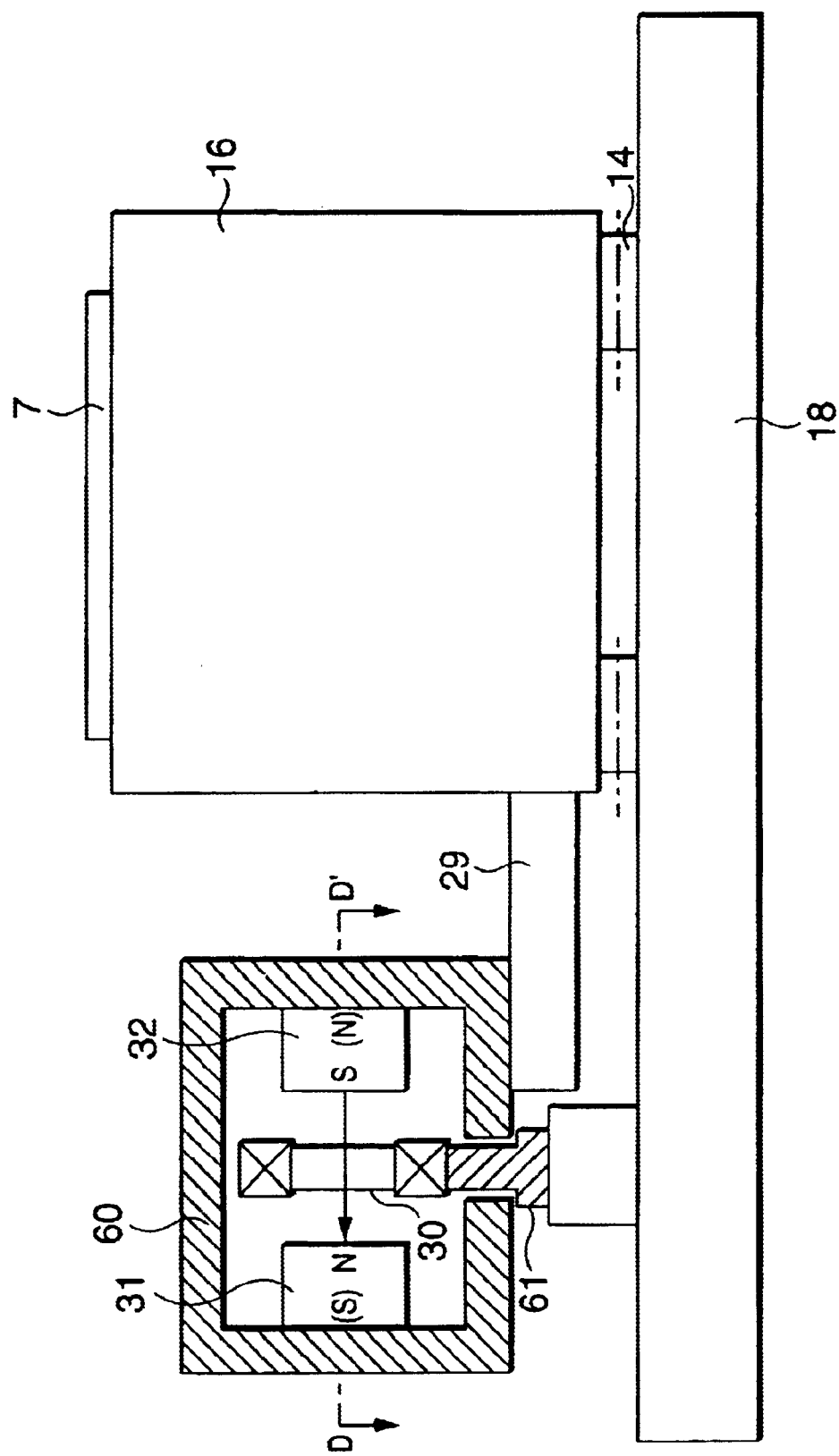
FIG. 19 is a view showing the structure of a sample stage portion in an electron beam lithography apparatus according to the fifth embodiment of the present invention.

FIG. 19 is a view showing the structure of a stage portion in an electron beam lithography apparatus according to the fifth embodiment of the present invention. This embodiment is related to a structure capable of making a shield member more compact and lightweight.

In this embodiment, a movable yoke 60 formed from a high-permeability material is fixed to the linear-motor-side end portion of a power transmission frame 29 which connects the sample stage and linear motor, and permanent magnets 31 and 32 are attached to opposing inner surfaces of the movable yoke 60. Between the opposing surfaces of the permanent magnets 31 and 32, a driving coil 30 is fixed on a surface plate 18 via a fixed yoke 61. That is, in this embodiment, the movable portion is formed on the side of the yoke 60 and permanent magnets 31 and 32 of the linear motor while the fixed portion is formed on the side of the yoke 61 and driving coil 30, unlike the above-described embodiments. The driving coil 30 is an coreless coil and has no magnetic core made of a ferromagnetic material. Hence, this driving coil 30 does not generate a magnetic field unless it is energized.

Figure 20:
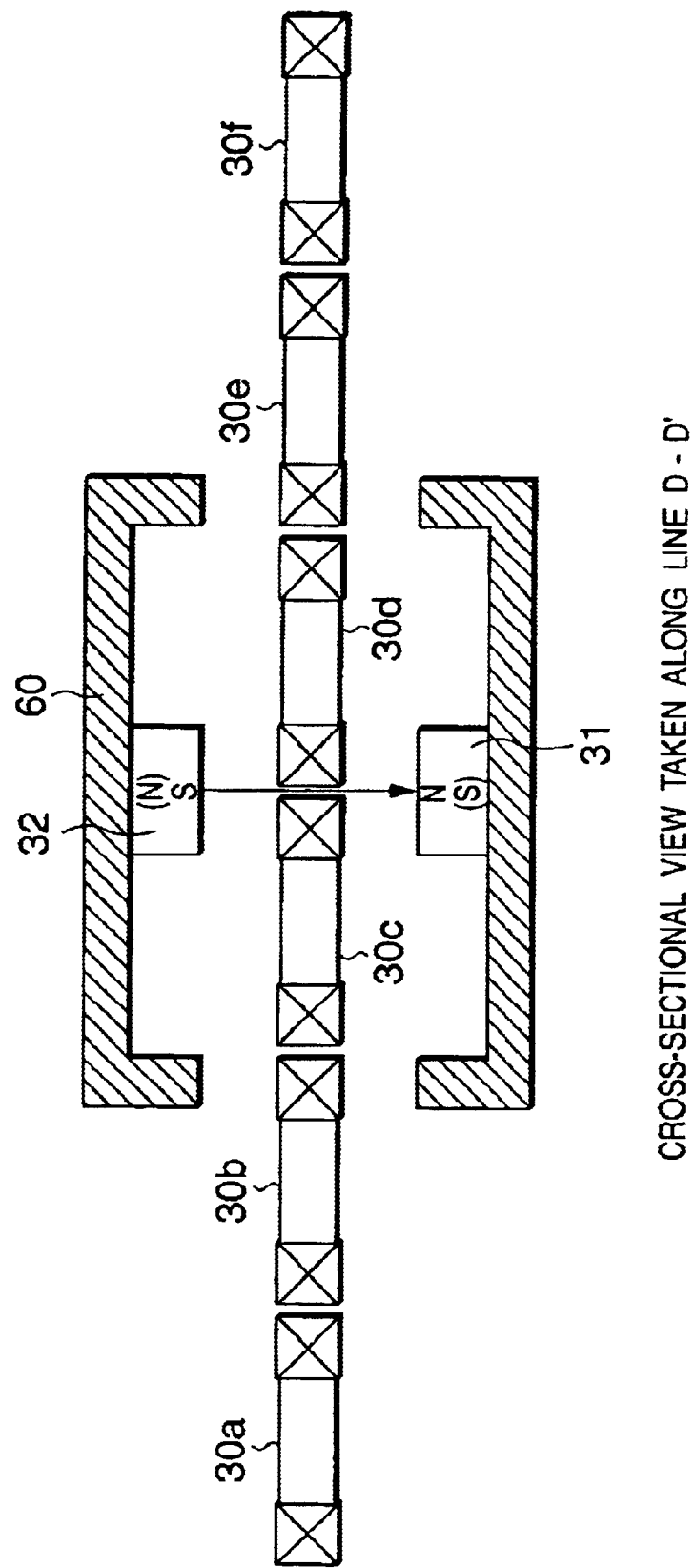
FIG. 20 is a cross-sectional view showing a structure taken along a line D–D' in FIG. 19.

FIG. 20 is a cross-sectional view showing a structure taken along a line D–D' in FIG. 19. Referring to FIG. 20, the driving coil comprises a plurality of driving coils 30a to 30f. The length of the movable yoke 60 in its moving direction is set to a length that allows the yoke 60 to surround driving coils (two driving coils 30c and 30d energized for driving) interacting with the permanent magnets 31 and 32 whereby the leakage magnetic field generated upon electromagnetically driving the stage can be shielded.

As described above, since driving coils (driving coils 30a, 30b, 30e, and 30f in FIG. 20) which are not surrounded by the movable yoke 60 are not energized and generate no magnetic field, no leakage magnetic field is generated from these portions. In the above-described second to fourth embodiments, a region almost equal to the entire moving range of the stage must be shielded by a member made of a high-permeability material. In this embodiment, however, since the movable permanent magnets 31 and 32 need be shielded, and only two driving coils (driving coils 30c and 30d in FIG. 20) interacting (energized) with the permanent magnets need be shielded, the required shield range becomes narrow, and the shield member can be made more compact and lightweight, as compared to the second to fourth embodiments. In addition, when only the two end portions of the driving coil group comprising the driving coils 30a to 30f in FIG. 20 are supported, the movable yoke shown in FIG. 19 can have a shape completely closed around the moving axis, and the leakage magnetic field from the permanent magnets 31 and 32 in the movable yoke can be further reduced.

Sixth Embodiment

Figure 21A:
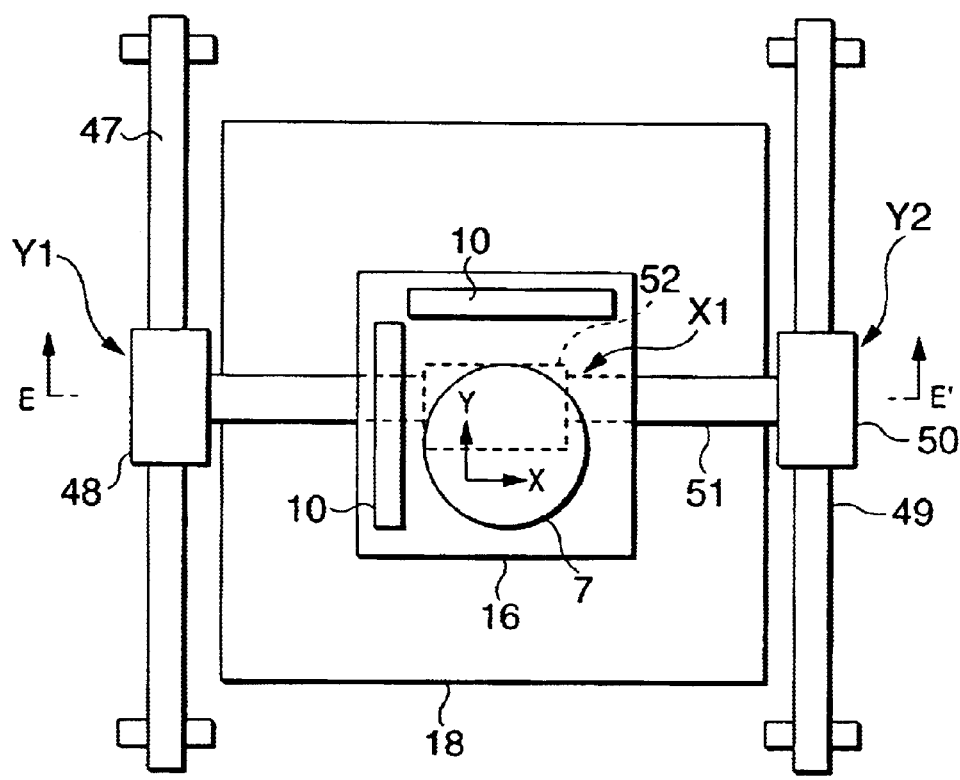
FIGS. 21A and 21B are plan and sectional views, respectively, showing the structure of a sample stage portion in an electron beam lithography apparatus according to the sixth embodiment of the present invention.
Figure 21B:
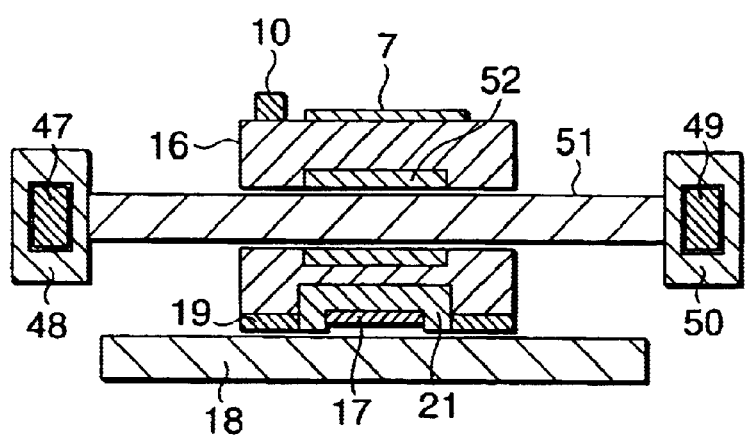

FIGS. 21A and 21B are views showing the structure of a stage portion in an electron beam lithography apparatus according to the sixth embodiment of the present invention. FIG. 21A is a plan view of the stage portion when viewed from the upper side. FIG. 21B is a sectional view taken along a line E–E' in FIG. 21A. In this embodiment, the stage having a leakage magnetic field shield for the pre-load applying permanent magnet in the first embodiment is driven by the linear motor according to one of the second to fifth embodiments.

In this embodiment, three single-axis linear motors are combined in an H shape such that a sample C, stage 16 can be two-dimensionally driven in the X and Y directions, as shown in FIGS. 21A and 21B. More specifically, the stage 16 is driven in the Y direction by two linear motors Y1 and Y2 and in the X direction by a linear motor X1.

In the linear motor Y1, a Y1 moving element 48 moves in the Y direction along a Y1 guide 47. In the linear motor Y2, a Y2 moving element 50 moves in the Y direction along a Y2 guide 49. The two ends of an X1 guide 51 of the linear motor X1 are connected to the Y1 moving element 48 and Y2 moving element 50, respectively, so that the linear motor X1 is moved in the Y direction by synchronous operation of the Y1 moving element 48 and Y2 moving element 50. In the linear motor X1, an X1 moving element 52 on which the sample stage 16 is mounted moves in the X direction along the X1 guide 51.

With the above driver arrangement, the sample stage 16 can two-dimensionally move in the X and Y directions, so lithography across the entire surface of a sample 7 can be realized. The two-dimensional position of the sample stage 16 is measured by measuring the X- and Y-direction positions of two bar mirrors 10 fixed on the sample stage 16 using a laser interferometer.

The leakage magnetic field strength from the linear motor decreases as the distance from the X1 moving element 52 increases. At the position of the sample 7 on the stage 16, the leakage magnetic field attenuates to a level that does not affect the electron beam irradiation position accuracy.

According to this embodiment, when the sample stage 16 is supported in a non-contact state, the portion that holds the sample 7 hardly deforms, and the sample 7 is not distorted. For this reason, accurate lithography can be realized. In addition, since the outer dimensions of the sample chamber can fall within the stage moving range and the installation area of the linear motors, a compact apparatus can be realized.

Seventh Embodiment

Figure 22:
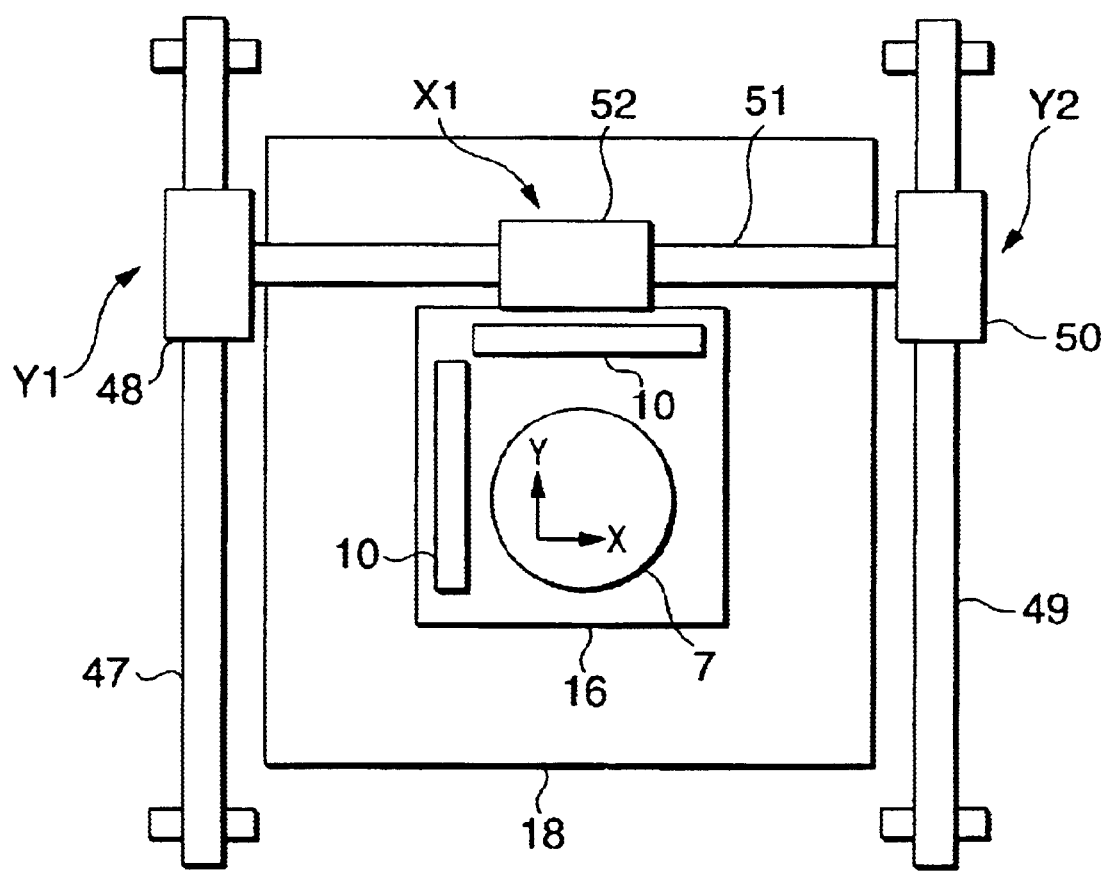
FIG. 22 is a plan view showing the structure of a sample stage portion in an electron beam lithography apparatus according to the seventh embodiment of the present invention.

FIG. 22 is a plan view showing the structure of a stage portion in an electron beam lithography apparatus according to the seventh embodiment of the present invention. The structure of the linear motor is the same as in the above-described sixth embodiment.

In the structure of the sixth embodiment, the sample stage 16 sometimes moves immediately under the electron optical lens-barrel during lithography. The leakage magnetic field from the electron lens is maximized at this position immediately under the electron optical lens-barrel. When the X1 moving element 52 moves to this position, an eddy current flows in the X1 moving element 52 made of a ferromagnetic material in accordance with the magnitude of the leakage magnetic field from the electron lens or the stage velocity. The magnetic field generated by this eddy current also degrades the electron beam irradiation position accuracy on the sample surface.

In the seventh embodiment, to suppress the eddy current flow to an X1 moving element 52, the X1 moving element 52 is attached to the side surface of a stage 16 main body such that the X1 moving element 52 does not come to the position immediately under the electron optical lens-barrel in the stage moving range. With this layout, the influence of the magnetic field generated when the eddy current flows to the X1 moving element 52 can be reduced, and accurate lithography can be realized.

Eighth Embodiment

Figure 23:
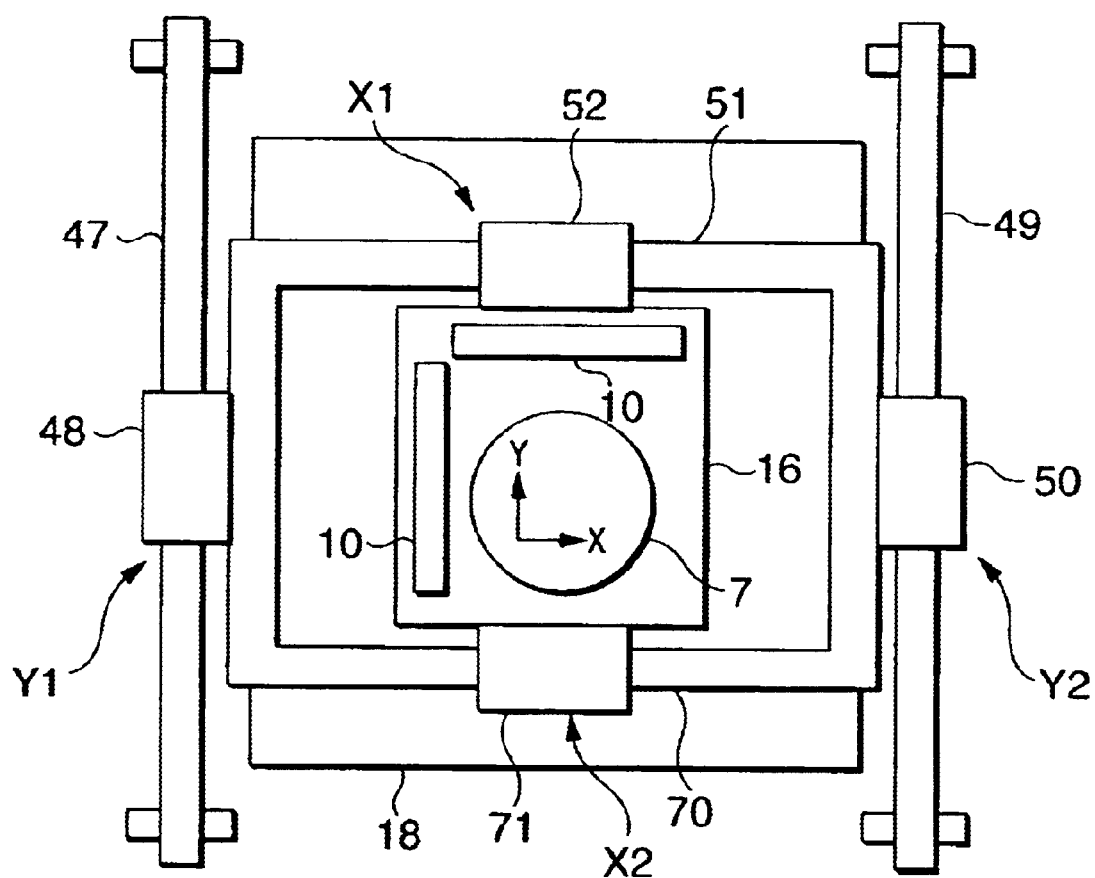
FIG. 23 is a plan view showing the structure of a sample stage portion in an electron beam lithography apparatus according to the eighth embodiment of the present invention.

FIG. 23 is a plan view showing the structure of a stage portion in an electron beam-lithography apparatus according to the eighth embodiment of the present invention.

In the stage structure of the above-described seventh embodiment, when the stage 16 is accelerated/decelerated in the X direction, the inertial force of the stage 16 acts on the X1 moving element 52, so the posture of the stage 16 readily changes in the yaw direction. In the eighth embodiment, two linear motors X1 and X2 for X-direction drive are arranged on both sides of a stage 16. In the linear motor X1, an X1 moving element 52 moves in the X direction on an X1 guide 51. In the linear motor X2, an X2 moving element 71 moves in the X direction on an X2 guide 70. The end portions of the X1 guide 51 and X2 guide 70 are coupled to a Y1 moving element 48 and Y2 moving element 50, thereby increasing the support rigidity and driving rigidity of the stage 16.

With the above structure, since the influence of the leakage magnetic field from the linear motors on the electron beam irradiation position accuracy can be suppressed, and stage movement with high support rigidity in the X direction can be realized, high-speed, accurate lithography can be executed.

Ninth Embodiment

Figure 24A:
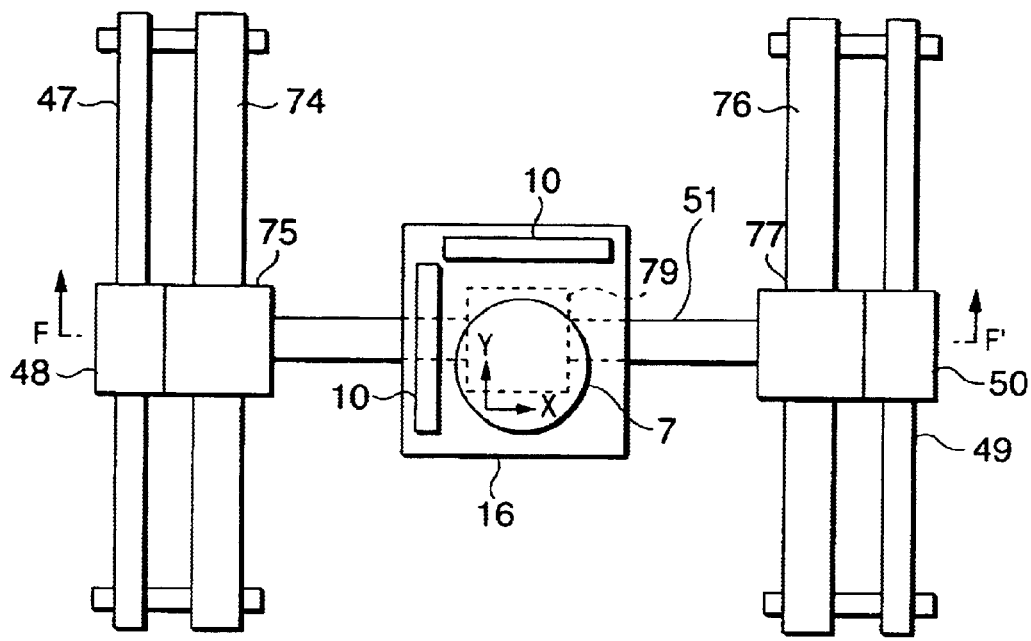
FIGS. 24A and 24B are plan and sectional views, respectively, showing the structure of a sample stage portion in an electron beam lithography apparatus according to the ninth embodiment of the present invention.
Figure 24B:
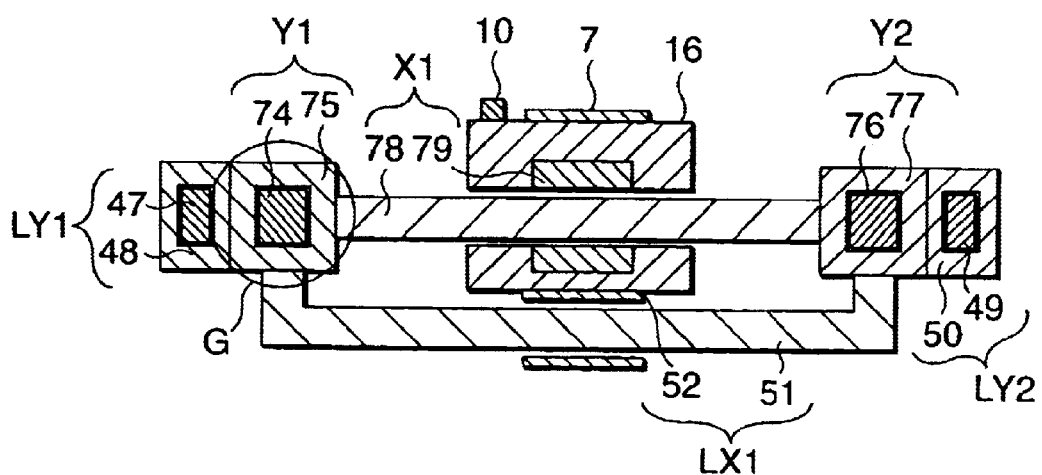

FIGS. 24A and 24B are plan and sectional views, respectively, showing the structure of a stage portion in an electron beam lithography apparatus according to the ninth embodiment of the present invention.

In this embodiment, to reduce the influence of the leakage magnetic field from the pre-load applying permanent magnet 17 used in the first embodiment and the leakage magnetic field of the linear motor X1 moving element 52 used in the second to eighth embodiments, a complete-constraint-type air bearing guide is used instead of the permanent magnet, and a linear motor is separated from a sample 7.

Figure 25:
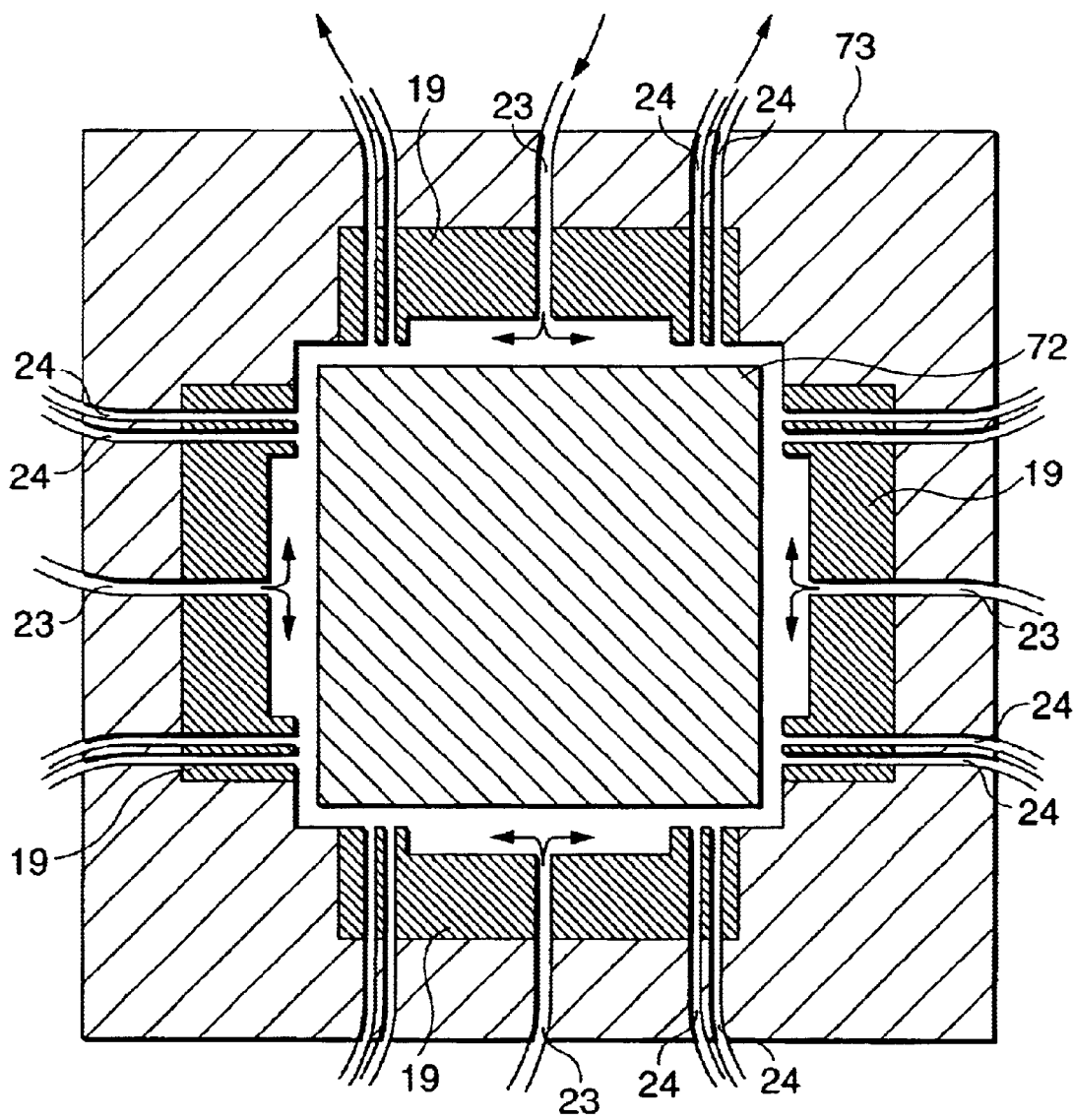
FIG. 25 is an enlarged view showing the detailed structure of a portion G shown in FIG. 24B.

As shown in FIG. 25, a single-axis air bearing is constructed by a static-pressure guide 72 and static-pressure moving element 73. Air pads 19 are attached inside the static-pressure moving element 73. Each air pad 19 has a blow port 23 and suction ports 24 and obtains a reaction (floating force) from the force of gas blown from the blow port 23. When the reactions of four air pads 19 balance, the degrees of freedom of the static-pressure moving element 73 except the moving direction are constrained. The blown gas is recovered from the suction ports 24.

Referring to FIGS. 24A and 24B, an air bearing Y1 is constructed by a Y1 static-pressure guide 74 and Y1 static-pressure moving element 75. The Y1 static-pressure moving element 75 can move with respect to the Y1 static-pressure guide 74 without slip. An air bearing Y2 is constructed by a Y2 static-pressure guide 76 and Y2 static-pressure moving element 77. An X1 static-pressure guide 78 is fixed to the Y1 static-pressure moving element 75 and Y2 static-pressure moving element 77. An X1 static-pressure moving element 79 can move with respect to the X1 static-pressure guide 78.

The Y1 static-pressure moving element 75 of the air bearing Y1 is driven by a linear motor LY1. An LY1 moving element 48 of the linear motor LY1 is coupled to the Y1 static-pressure moving element 75. An LY1 guide 47 of the linear motor LY1 is arranged parallel to the Y1 static-pressure guide 74 of the air bearing Y1. In arranging the Y1 static-pressure guide 74 and LY1 guide 47 in parallel, a small parallelism error occurs. However, since the allowable value of the positional shift between the LY1 moving element 48 and the LY1 guide 47 is several mm, the LY1 moving element 48 follows the track of the Y1 static-pressure moving element 75. Additionally, in this embodiment, to suppress the leakage magnetic field from the linear motor and magnetic field generated by an eddy current, the linear motor LY1 is arranged on the opposite side of the sample 7 with respect to the air bearing Y1, i.e., as a position more separated from the sample 7.

The method of driving the Y2 static-pressure moving element 77 of the air bearing Y2 is the same as described above. The Y2 static-pressure moving element 77 is driven by a linear motor LY2 constructed by an LY2 guide 49 and LY2 moving element 50.

The X1 static-pressure moving element 79 of the air bearing X1 is driven by a linear motor LX1. The two end portions of an LX1 guide 51 of the linear motor LX1 are coupled to the Y1 static-pressure moving element 75 and Y2 static-pressure moving element 77, respectively. For the linear motor LX1 as well, to reduce the leakage magnetic field therefrom and a magnetic field generated by an eddy current, the linear motor LX1 is arranged below the air bearing X1.

As described above, when an X-Y stage constrained to float by the complete-restriction-type air bearing guide is driven by three linear motors separated from the position of the sample 7, the leakage magnetic field from the linear motors can be reduced, and the magnetic field generated by the eddy current in moving the linear motor moving elements (ferromagnetic material) can be suppressed. Hence, accurate lithography can be realized.

10th Embodiment

FIGS. 26A to 26D are sectional views showing steps in manufacturing a semiconductor integrated circuit element using the electron beam lithography apparatus of the present invention as the 10th embodiment of the present invention. FIGS. 26A to 26D are element sectional views showing steps in manufacturing the element.

An experimental embodiment will be shown here. A lithography method using the electron beam lithography apparatus of the present invention was applied not to all pattern formation processes but to only the patterning process of a photosensitive agent 109 shown in FIG. 26C. For the remaining processes, the conventional lithography method was used and compared with the effect of the present invention.

Figure 26A:
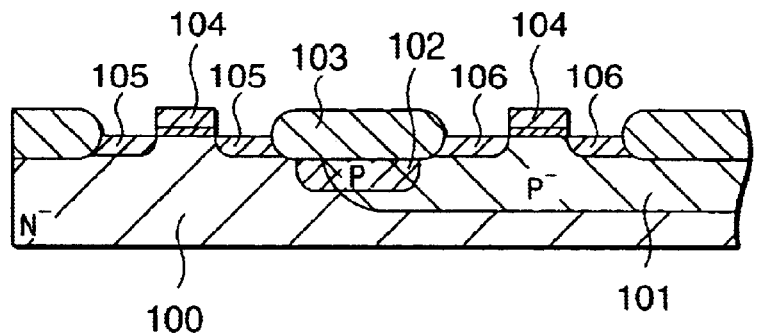
FIGS. 26A to 26D are sectional views showing a method of manufacturing a semiconductor integrated circuit element using the electron beam lithography apparatus of the present invention as the 10th embodiment of the present invention.
Figure 26B:
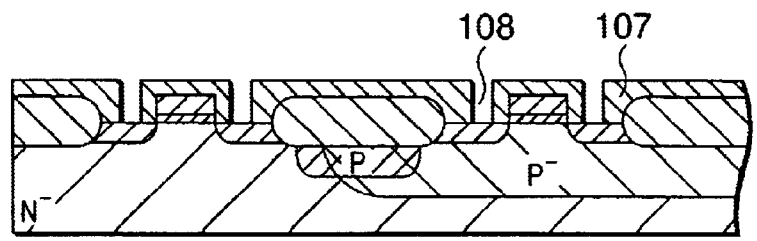

First, a p-well layer 101, p-layer 102, field oxide film 103, polysilicon/silicon oxide film gate 104, heavily doped p-diffusion layer 105, and heavily doped n-diffusion layer 106 were formed on an n-silicon substrate 100 by the conventional method (FIG. 26A).

An insulating film 107 of phosphosilicate glass (PSG) was formed and removed by dry etching to form contact holes 108 (FIG. 268).

Figure 26C:
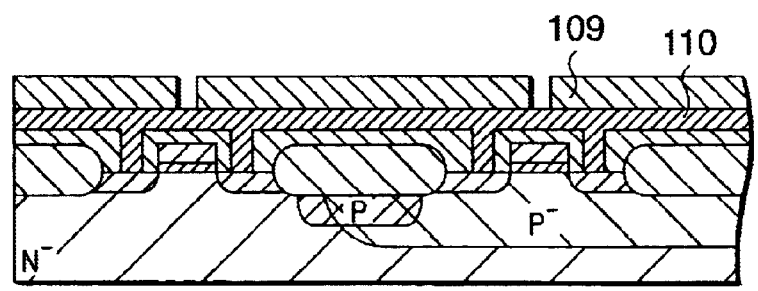

After a material for a W/TiN electrode interconnection 110 was formed by the conventional method, the photosensitive agent 109 was coated thereon. The photosensitive agent 109 was patterned by the electron beam lithography method using the electron beam lithography apparatus of the present invention. The W/TiN electrode interconnection 110 was formed by, e.g., dry etching (FIG. 26C).

Figure 26D:
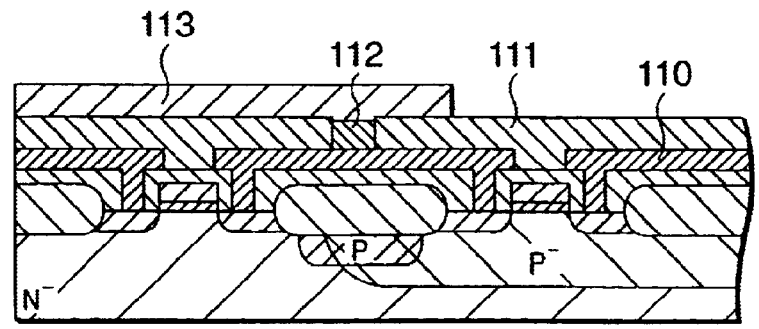

An insulating interlayer 111 was formed. A hole pattern 112 was formed by the conventional method. A W plug was buried in the hole pattern 112. A second Al interconnection 113 was connected to the W plug (FIG. 26D). The conventional method was used in the subsequent passivation process.

In this embodiment, only main manufacturing processes have been described. The same method as in the prior art was used except in the lithography process for W/TiN electrode interconnection formation for which the electron beam lithography method of the present invention was used. With the above processes, a fine pattern was accurately formed, and CMOS LSIs were manufactured at high yield. When semiconductor integrated circuit elements were manufactured using the electron beam lithography apparatus of the present invention, resolution errors in interconnections could be prevented, and the yield of non-defective products largely improved.

According to the present invention, since the support/guide mechanism of the sample stage has a non-contact structure, the table member on which a sample is placed can be prevented from deforming as the stage moves, and the stage can be accurately moved. Hence, accurate lithography can be realized.

As many apparently widely different embodiments of the present invention can be made without departing from the spirit and scope thereof, it is to be understood that the invention is not limited to the specific embodiments thereof except as defined in the appended claims.

What is claimed is:

1. An electron beam lithography apparatus including an electron optical lens-barrel having an electron lens for converging an electron beam and a deflector for deflecting the electron beam, a sample chamber for holding a sample to be subjected to lithography in a vacuum state, and a sample stage on which the sample is placed, said apparatus comprising:

a magnetic force generator for applying a pre-load to the sample stage; and a first magnetic field shield for shielding a magnetic field from said magnetic force generator to an internal space in the sample chamber.

2. The apparatus according to claim 1, further comprising a surface plate for guiding the sample stage, wherein said magnetic force generator includes a permanent magnet and the sample stage is attracted to said surface plate by an attracting force of said permanent magnet.

3. A stage used in an electron beam lithography apparatus, comprising:

a sample stage on which a sample is placed;

a magnetic force generator for applying a pre-load to said sample stage; and a magnetic field shield for shielding a magnetic field from said magnetic force generator.

4. The stage according to claim 3, wherein said sample stage is supported to float on a surface plate by air.

5. The stage according to claim 3, wherein said magnetic field shield is provided outside said magnetic force generator.

6. The stage according to claim 3, wherein letting t1 be a distance between a surface plate for guiding said magnetic force generator and a surface, opposing the surface plate, of said magnetic force generator, and t2 be a distance between an edge portion of said magnetic field shield and the surface plate, a relationship t1>t2 is satisfied.

7. An electron beem lithography method using an electron beam lithography apparatus comprising an electron optical lens-barrel having an electron lens for converging an electron beam and a deflector for deflecting the electron beam, a surface plate, a sample stage movable on the surface plate, a magnetic force generator for applying a pre-load to the sample stage, and a magnetic field shield for shielding a magnetic field from the magnetic force generator, comprising the steps of:

placing a sample on the sample stage; and directly drawing a pattern on the sample using the electron beam.

8. The apparatus according to claim 1, further comprising a second magnetic field shield for shielding a magnetic field from the electron optical lens-barrel to the internal space in the sample chamber.

9. The apparatus according to claim 1, further comprising a second magnetic field shield for shielding a leakage magnetic field from the first magnetic field shield to the internal space in the sample chamber.

10. The apparatus according to claim 2, wherein said first magnetic field shield is arranged to surround surfaces of said permanent magnet except a surface opposing said surface plate.

11. The apparatus according to claim 2, wherein said sample stage is supported to float on said surface plate by air.

12. The apparatus according to claim 3, wherein said magnetic force generator includes a permanent magnet, said sample stage being attracted to a surface plate for guiding said sample stage by an attracting force of said permanent magnet.

13. The stage according to claim 3, further comprising a second magnetic field shield for shielding a leakage magnetic field from the first magnetic field shield to the internal space in the sample chamber.

14. The stage according to claim 12, wherein said first magnetic field shield is arranged to surround surfaces of said permanent magnet except a surface opposing said surface plate.

15. A motor comprising:

a first yoke provided with an electromagnetic coil; and a second yoke arranged to move relative to the first yoke, the second yoke being provided with a magnet, having a facing surface facing the electromagnetic coil and a non-facing surface that is a surface other than the facing surface, and a magnetic field shield surrounding the non-facing surface of the magnet.

16. A motor comprising:

a first yoke provided with an electromagnetic coil; and a second yoke arranged to move relative to the first yoke, the second yoke being provided a first magnet having a first side facing the electromagnetic coil, a second magnet having a second side facing the electromagnetic coil, and a magnetic field shield, the first and second sides being directed to directions different from each other, the magnetic field shield being arranged to surround sides of the first and second magnets which are opposite sides of the first and second sides.

17. A linear motor comprising:

a first yoke provided with a plurality of electromagnetic coils arranged along a first direction; and a second yoke arranged to move, relative to the first yoke, along a direction substantially parallel to the first direction, the second yoke being provided with a magnet, having a facing surface facing at least one of the electromagnetic coils and a non-facing surface that is a surface other than the facing surface, and a magnetic field shield surrounding the non-facing surface of the magnet.

18. The linear motor according to claim 17, wherein a dimension of the magnetic field shield in the first direction is smaller than a movable range of the second yoke.

19. The linear motor according to claim 17, wherein
the second yoke moves relative to the first yoke by energizing two electromagnetic coils of the plurality of electromagnetic coils, and
a dimension of the magnetic field shield in the first direction is such that the magnetic field shield can surround the two electromagnetic coils.

20. The linear motor according to claim 17, wherein the first yoke is used as a fixed yoke and the second yoke is used as a movable yoke.

21. The linear motor according to claim 17, wherein the linear motor is arranged to be used in a processing device performing a process by using an electron beam.

22. A linear motor comprising:
a first yoke provided with a plurality of electromagnetic coils arranged along a first direction; and
a second yoke arranged to move, relative to the first yoke, along a direction substantially parallel to the first direction, the second yoke being provided a first magnet having a first side facing at least one electromagnetic coil, a second magnet having a second side facing at least one electromagnetic coil, and a magnetic field shield, the first and second sides being directed to directions different from each other, the magnetic field shield being arranged to surround sides of the first and second magnets which are opposite sides of the first and second sides.

23. The linear motor according to claim 22, wherein the first magnet and the second magnet are arranged to face both sides of the at least one electromagnetic coil.

24. The linear motor according to claim 22, wherein the first yoke is used as a fixed yoke and the second yoke is used as a movable yoke.

25. The linear motor according to claim 22, wherein the linear motor is arranged to be used in a processing device performing a process by using an electron beam.

26. A sample moving device comprising:
a first yoke provided with a plurality of electromagnetic coils arranged along a first direction;
a second yoke arranged to move, relative to the first yoke, along a direction substantially parallel to the first direction, the second yoke being provided with a magnet, having a facing surface facing at least one electromagnetic coil and a non-facing surface that is a surface other than the facing surface, and a magnetic field shield surrounding the non-facing surface of the magnet; and
a holder arranged to hold a sample, the holder being attached to a member comprising the first yoke or a member comprising the second yoke.

27. A sample moving device comprising:
a first yoke provided with a plurality of electromagnetic coils arranged along a first direction;
a second yoke arranged to move, relative to the first yoke, along a direction substantially parallel to the first direction, the second yoke being provided a first magnet having a first side facing at least one electromagnetic coil, a second magnet having a second side facing at least one electromagnetic coil, and a magnetic field shield, the first and second sides being directed to directions different from each other, the magnetic field shield being arranged to surround sides of the first and second magnets which are opposite sides of the first and second sides; and
a holder arranged to hold a sample, the holder being attached to a member comprising the first yoke or a member comprising the second yoke.

28. A stage comprising:
a fixed yoke provided with an electromagnetic coil;
a movable yoke arranged to move relative to the fixed yoke, the movable yoke being provided with a magnet, having a facing surface facing the electromagnetic coil and a non-facing surface that is a surface other than the facing surface, and a magnetic field shield surrounding the non-facing surface of the magnet; and
a table on which a sample is placed, the table being attached to a member comprising the movable yoke.

29. A stage comprising:
a fixed yoke provided with an electromagnetic coil; and
a movable yoke arranged to move relative to the fixed yoke, the movable yoke being provided a first magnet having a first side facing the electromagnetic coil, a second magnet having a second side facing the electromagnetic coil, and a magnetic field shield, the first and second sides being directed to directions different from each other, the magnetic field shield being arranged to surround sides of the first and second magnets which are opposite sides of the first and second sides; and
a table on which a sample is placed, the table being attached to a member comprising the movable yoke.

30. A stage comprising:
a first fixed yoke provided with a plurality of electromagnetic coils arranged along a first direction;
a first movable yoke arranged to move, relative to the first fixed yoke, along a direction substantially parallel to the first direction, the first movable yoke being provided with a first magnet, having a first facing surface facing at least one electromagnetic coil and a first non-facing surface that is a surface other than the first facing surface, and a first magnetic field shield surrounding the first non-facing surface of the first magnet;
a second fixed yoke provided with a plurality of electromagnetic coils arranged along a second direction substantially perpendicular to the first direction;
a second movable yoke arranged to move, relative to the second fixed yoke, along a direction substantially parallel to the second direction, the second movable yoke being provided with a second magnet, having a second facing surface facing at least one electromagnetic coil and a second non-facing surface that is a surface other than the second facing surface, and a second magnetic field shield surrounding the second non-facing surface of the second magnet; and
a table on which a sample is placed, the table moving with the first movable yoke and the second movable yoke in directions substantially parallel to respective ones of the first and second directions.

31. An apparatus for patterning a sample with an electron beam, the apparatus comprising:
an electron beam source;
a fixed yoke provided with an electromagnetic coil;
a movable yoke arranged to move relative to the fixed yoke, the movable yoke being provided with a magnet, having a facing surface facing the electromagnetic coil and a non-facing surface that is a surface other than the facing surface, and a magnetic field shield surrounding the non-facing surface of the magnet; and a table on which a sample is placed, the table being attached to a member comprising the movable yoke.

32. An apparatus for patterning a sample with an electron beam, the apparatus comprising:

an electron beam source;

a fixed yoke provided with an electromagnetic coil; and a movable yoke arranged to move relative to the fixed yoke, the movable yoke being provided a first magnet having a first side facing the electromagnetic coil, a second magnet having a second side facing the electromagnetic coil, and a magnetic field shield, the first and second sides being directed to directions different from each other, the magnetic field shield being arranged to surround sides of the first and second magnets which are opposite sides of the first and second sides; and a table on which a sample is placed, the table being attached to a member comprising the movable yoke.

33. An apparatus for patterning a sample with an electron beam, the apparatus comprising:

an electron beam source;

a first fixed yoke provided with a plurality of electromagnetic coils arranged along a first direction;

a first movable yoke arranged to move, relative to the first fixed yoke, along a direction substantially parallel to the first direction, the first movable yoke being provided with a first magnet, having a first facing surface facing the electromagnetic coil and a non-facing surface that is a surface other than the first facing surface, and a first magnetic field shield surrounding the first non-facing surface of the first magnet;

a second fixed yoke provided with a plurality of electromagnetic coils arranged along a second direction substantially perpendicular to the first direction;

a second movable yoke arranged to move, relative to the second fixed yoke, along a direction substantially parallel to the second direction, the second movable yoke being provided with a second magnet, having a second facing surface facing the electromagnetic coil and a second non-facing surface that is a surface other than the second non-facing surface, and a second magnetic field shield surrounding the second non-facing surface of the second magnet; and a table on which a sample is placed, the table moving with the first movable yoke and the second movable yoke in directions substantially parallel to respective ones of the first and second directions.

34. A device manufacturing method comprising:

coating a photosensitive agent on a sample; and patterning the sample coated with the photosensitive agent by using the apparatus defined in claim 31.

35. A device manufacturing method comprising:

coating a photosensitive agent on a sample; and patterning the sample coated with the photosensitive agent by using the apparatus defined in claim 32.

36. A device manufacturing method comprising:

coating a photosensitive agent on a sample; and patterning the sample coated with the photosensitive agent by using the apparatus defined in claim 33.

37. A stage comprising:

a surface plate;

a table on which a sample is placed;

a driver having a magnet and an electromagnetic coil and controlling a position of the table relative to the surface plate;

a first magnetic field shield disposed between the driver and the sample; and a second magnetic field shield disposed between the first magnetic field shield and the sample.

38. The stage according to claim 37, wherein the first magnetic field shield comprises a ferromagnetic material and the second magnetic field shield comprises a high-permeability material.

39. The stage according to claim 37, wherein the first magnetic field shield comprises an iron-based material and the second magnetic filed shield comprises Permalloy.

40. The stage according to claim 37, wherein the magnet is attached to the surface plate and the electromagnetic coil is attached to the table.

41. The stage according to claim 40, further comprising:

a spacer of a non-magnetic material disposed between the first magnetic field shield and the second magnetic field shield.

42. An apparatus for patterning a sample with an electron beam, the apparatus comprising:

an electron beam source;

a stage surface plate;

a table on which a sample is placed;

a driver having a magnet and an electromagnetic coil and controlling a position of the table relative to the stage surface plate;

a first magnetic field shield disposed between the driver and the sample; and a second magnetic field shield disposed between the first magnetic field shield and the sample.

43. A device manufacturing method comprising:

coating a photosensitive agent on a sample; and patterning the sample coated with the photosensitive agent by using the apparatus defined in claim 42.

* * * * *

UNITED STATES PATENT AND TRADEMARK OFFICE
CERTIFICATE OF CORRECTION

PATENT NO. : 6,730,916 B1
APPLICATION NO. : 09/691234
DATED : May 4, 2004
INVENTOR(S) : Hiroshi Tsuji et al.

It is certified that error appears in the above-identified patent and that said Letters Patent is hereby corrected as shown below:

ON TITLE PAGE AT (73) ASSIGNEE

"Canon Kabushiki Kaisha, Tokyo (JP)" should read --Canon Kabushiki Kaisha, Tokyo (JP), and Hitachi Ltd., Tokyo (JP)--.

ON TITLE PAGE AT (56) U.S. PATENT DOCUMENTS

Insert: --6,614,034 B2   9/2003  Nakasuji--.

COLUMN 2

Line 23, "$9.1 \times 10^{-3}$ (kg)" should read --$9.1 \times 10^{-31}$ (kg)--; and
Line 24, "$1.6 \times 10^{-8}$ (C)" should read --$1.6 \times 10^{-19}$ (C)--.

COLUMN 3

Line 6, close up right margin;
Line 7, "A" should be deleted, and close up left margin.

COLUMN 9

Line 30, "an" should read --a--.

Signed and Sealed this

Third Day of June, 2008

JON W. DUDAS
*Director of the United States Patent and Trademark Office*